(12) United States Patent
Weingarten et al.

(10) Patent No.: US 8,321,625 B2
(45) Date of Patent: Nov. 27, 2012

(54) FLASH MEMORY DEVICE WITH PHYSICAL CELL VALUE DETERIORATION ACCOMMODATION AND METHODS USEFUL IN CONJUNCTION THEREWITH

(75) Inventors: Hanan Weingarten, Herzelia (IL); Shmuel Levy, Qiryat Tivon (IL); Michael Katz, Haifa (IL)

(73) Assignee: Densbits Technologies Ltd., Haifa (IL)

( * ) Notice: Subject to any disclaimer, the term of this patent is extended or adjusted under 35 U.S.C. 154(b) by 212 days.

(21) Appl. No.: 12/667,042

(22) PCT Filed: Sep. 17, 2008

(86) PCT No.: PCT/IL2008/001239
§ 371 (c)(1),
(2), (4) Date: Dec. 29, 2009

(87) PCT Pub. No.: WO2009/072104
PCT Pub. Date: Jun. 11, 2009

(65) Prior Publication Data
US 2010/0180073 A1    Jul. 15, 2010

Related U.S. Application Data

(60) Provisional application No. 60/996,782, filed on Dec. 5, 2007, provisional application No. 61/006,805, filed on Jan. 31, 2008, provisional application No. 61/064,853, filed on Mar. 31, 2008, provisional application No. 61/071,465, filed on Apr. 30, 2008, provisional application No. 61/129,608, filed on Jul. 8, 2008.

(51) Int. Cl.
*G06F 12/02* (2006.01)

(52) U.S. Cl. .................. 711/103; 711/E12.008

(58) Field of Classification Search .................. None
See application file for complete search history.

(56) References Cited

U.S. PATENT DOCUMENTS

| | | | |
|---|---|---|---|
| 4,463,375 A * | 7/1984 | Macovski | 378/98.12 |
| 4,584,686 A | 4/1986 | Fritze | |
| 4,589,084 A | 5/1986 | Fling et al. | |
| 4,866,716 A | 9/1989 | Weng | |
| 5,077,737 A | 12/1991 | Leger et al. | |
| 5,297,153 A | 3/1994 | Baggen et al. | |
| 5,657,332 A | 8/1997 | Auclair et al. | |
| 5,729,490 A | 3/1998 | Calligaro et al. | |
| 5,793,774 A | 8/1998 | Usui et al. | |
| 5,926,409 A | 7/1999 | Engh et al. | |
| 5,956,268 A | 9/1999 | Lee | |

(Continued)

OTHER PUBLICATIONS

International Search Report for International Application No. PCT/IL08/01239 mailed Feb. 12, 2009.

(Continued)

*Primary Examiner* — Edward Dudek, Jr.
*Assistant Examiner* — Ryan Dare
(74) *Attorney, Agent, or Firm* — SNR Denton US LLP

(57) ABSTRACT

A method for determining thresholds useful for converting cell physical levels into cell logical values in an array of digital memory cells storing physical levels which diminish over time, the method comprising determining extent of deterioration of the physical levels and determining thresholds accordingly for at least an individual cell in said array; and reading the individual cell including reading a physical level in the cell and converting the physical level into a logical value using the thresholds, wherein the determining comprises storing predefined physical levels rather than data-determined physical levels in each of a plurality of cells and computing extent of deterioration by determining deterioration of the predefined physical levels.

29 Claims, 14 Drawing Sheets

U.S. PATENT DOCUMENTS

| | | | |
|---|---|---|---|
| 5,982,659 A * | 11/1999 | Irrinki et al. | 365/168 |
| 6,038,634 A | 3/2000 | Ji et al. | |
| 6,094,465 A | 7/2000 | Stein et al. | |
| 6,119,245 A | 9/2000 | Hiratsuka | |
| 6,182,261 B1 | 1/2001 | Haller et al. | |
| 6,192,497 B1 | 2/2001 | Yang et al. | |
| 6,195,287 B1 | 2/2001 | Hirano | |
| 6,199,188 B1 | 3/2001 | Shen et al. | |
| 6,209,114 B1 | 3/2001 | Wolf et al. | |
| 6,259,627 B1 | 7/2001 | Wong | |
| 6,278,633 B1 | 8/2001 | Wong et al. | |
| 6,279,133 B1 | 8/2001 | Vafai et al. | |
| 6,301,151 B1 | 10/2001 | Engh et al. | |
| 6,370,061 B1 | 4/2002 | Yachareni et al. | |
| 6,374,383 B1 | 4/2002 | Weng | |
| 6,504,891 B1 | 1/2003 | Chevallier | |
| 6,532,169 B1 | 3/2003 | Mann et al. | |
| 6,532,556 B1 | 3/2003 | Wong et al. | |
| 6,553,533 B2 | 4/2003 | Demura et al. | |
| 6,560,747 B1 | 5/2003 | Weng | |
| 6,637,002 B1 | 10/2003 | Weng et al. | |
| 6,639,865 B2 | 10/2003 | Kwon | |
| 6,674,665 B1 | 1/2004 | Mann et al. | |
| 6,704,902 B1 | 3/2004 | Shinbashi et al. | |
| 6,751,766 B2 | 6/2004 | Guterman et al. | |
| 6,772,274 B1 | 8/2004 | Estakhri | |
| 6,781,910 B2 | 8/2004 | Smith | |
| 6,792,569 B2 | 9/2004 | Cox et al. | |
| 6,873,543 B2 | 3/2005 | Smith et al. | |
| 6,891,768 B2 | 5/2005 | Smith et al. | |
| 6,914,809 B2 | 7/2005 | Hilton et al. | |
| 6,915,477 B2 * | 7/2005 | Gollamudi et al. | 714/774 |
| 6,952,365 B2 | 10/2005 | Gonzalez et al. | |
| 6,961,890 B2 | 11/2005 | Smith | |
| 6,990,012 B2 | 1/2006 | Smith et al. | |
| 6,996,004 B1 | 2/2006 | Fastow et al. | |
| 6,999,854 B2 | 2/2006 | Roth | |
| 7,010,739 B1 | 3/2006 | Feng et al. | |
| 7,012,835 B2 | 3/2006 | Gonzalez et al. | |
| 7,038,950 B1 | 5/2006 | Hamilton et al. | |
| 7,068,539 B2 | 6/2006 | Guterman et al. | |
| 7,079,436 B2 | 7/2006 | Perner et al. | |
| 7,149,950 B2 | 12/2006 | Spencer et al. | |
| 7,177,977 B2 | 2/2007 | Chen et al. | |
| 7,191,379 B2 | 3/2007 | Adelmann et al. | |
| 7,196,946 B2 | 3/2007 | Chen et al. | |
| 7,203,874 B2 | 4/2007 | Roohparvar | |
| 7,290,203 B2 | 10/2007 | Emma et al. | |
| 7,292,365 B2 | 11/2007 | Knox | |
| 7,301,928 B2 | 11/2007 | Nakabayashi et al. | |
| 7,441,067 B2 | 10/2008 | Gorobets et al. | |
| 7,466,575 B2 | 12/2008 | Shalvi et al. | |
| 7,533,328 B2 | 5/2009 | Alrod et al. | |
| 7,558,109 B2 | 7/2009 | Brandman et al. | |
| 7,593,263 B2 | 9/2009 | Sokolov et al. | |
| 7,697,326 B2 | 4/2010 | Sommer et al. | |
| 7,706,182 B2 | 4/2010 | Shalvi et al. | |
| 7,804,718 B2 | 9/2010 | Kim | |
| 7,805,663 B2 | 9/2010 | Brandman et al. | |
| 7,805,664 B1 | 9/2010 | Yang et al. | |
| 7,844,877 B2 | 11/2010 | Litsyn et al. | |
| 7,961,797 B1 | 6/2011 | Yang et al. | |
| 8,020,073 B2 | 9/2011 | Emma et al. | |
| 8,122,328 B2 | 2/2012 | Liu et al. | |
| 2002/0063774 A1 | 5/2002 | Hillis et al. | |
| 2002/0085419 A1 | 7/2002 | Kwon et al. | |
| 2002/0154769 A1 | 10/2002 | Petersen et al. | |
| 2003/0065876 A1 | 4/2003 | Lasser | |
| 2003/0101404 A1 | 5/2003 | Zhao et al. | |
| 2003/0105620 A1 | 6/2003 | Bowen | |
| 2003/0192007 A1 | 10/2003 | Miller et al. | |
| 2004/0015771 A1 | 1/2004 | Lasser et al. | |
| 2004/0030971 A1 | 2/2004 | Tanaka et al. | |
| 2004/0153722 A1 | 8/2004 | Lee | |
| 2004/0153817 A1 | 8/2004 | Norman et al. | |
| 2004/0181735 A1 | 9/2004 | Xin | |
| 2005/0013165 A1 | 1/2005 | Ban | |
| 2005/0018482 A1 | 1/2005 | Cemea et al. | |
| 2005/0083735 A1 | 4/2005 | Chen et al. | |
| 2005/0117401 A1 | 6/2005 | Chen et al. | |
| 2005/0120265 A1 | 6/2005 | Pline et al. | |
| 2005/0128811 A1 | 6/2005 | Kato et al. | |
| 2005/0138533 A1 | 6/2005 | Le-Bars et al. | |
| 2005/0144213 A1 | 6/2005 | Simkins et al. | |
| 2005/0144368 A1 | 6/2005 | Chung et al. | |
| 2005/0169057 A1 | 8/2005 | Shibata et al. | |
| 2005/0172179 A1 | 8/2005 | Brandenberger et al. | |
| 2005/0213393 A1 | 9/2005 | Lasser | |
| 2006/0059406 A1 | 3/2006 | Micheloni et al. | |
| 2006/0059409 A1 | 3/2006 | Lee | |
| 2006/0064537 A1 | 3/2006 | Oshima et al. | |
| 2006/0101193 A1 | 5/2006 | Murin | |
| 2006/0203587 A1 * | 9/2006 | Li et al. | 365/207 |
| 2006/0221692 A1 | 10/2006 | Chen | |
| 2006/0248434 A1 | 11/2006 | Radke et al. | |
| 2006/0268608 A1 | 11/2006 | Noguchi et al. | |
| 2006/0294312 A1 | 12/2006 | Walmsley | |
| 2007/0025157 A1 | 2/2007 | Wan et al. | |
| 2007/0063180 A1 | 3/2007 | Asano et al. | |
| 2007/0103992 A1 | 5/2007 | Sakui et al. | |
| 2007/0104004 A1 | 5/2007 | So et al. | |
| 2007/0109858 A1 | 5/2007 | Conley et al. | |
| 2007/0124652 A1 | 5/2007 | Litsyn et al. | |
| 2007/0143561 A1 | 6/2007 | Gorobets | |
| 2007/0150694 A1 | 6/2007 | Chang et al. | |
| 2007/0168625 A1 | 7/2007 | Cornwell et al. | |
| 2007/0171714 A1 | 7/2007 | Wu et al. | |
| 2007/0171730 A1 | 7/2007 | Ramamoorthy et al. | |
| 2007/0180346 A1 | 8/2007 | Murin | |
| 2007/0223277 A1 | 9/2007 | Tanaka et al. | |
| 2007/0226582 A1 | 9/2007 | Tang et al. | |
| 2007/0226592 A1 | 9/2007 | Radke | |
| 2007/0228449 A1 | 10/2007 | Takano et al. | |
| 2007/0253249 A1 | 11/2007 | Kang et al. | |
| 2007/0253250 A1 | 11/2007 | Shibata et al. | |
| 2007/0263439 A1 | 11/2007 | Cornwell et al. | |
| 2007/0266291 A1 | 11/2007 | Toda et al. | |
| 2007/0271494 A1 | 11/2007 | Gorobets | |
| 2008/0010581 A1 | 1/2008 | Alrod et al. | |
| 2008/0028014 A1 | 1/2008 | Hilt et al. | |
| 2008/0055989 A1 | 3/2008 | Lee et al. | |
| 2008/0082897 A1 | 4/2008 | Brandman et al. | |
| 2008/0092026 A1 | 4/2008 | Brandman et al. | |
| 2008/0104309 A1 | 5/2008 | Cheon et al. | |
| 2008/0116509 A1 | 5/2008 | Harari et al. | |
| 2008/0126686 A1 | 5/2008 | Sokolov et al. | |
| 2008/0127104 A1 | 5/2008 | Li et al. | |
| 2008/0128790 A1 | 6/2008 | Jung | |
| 2008/0130341 A1 | 6/2008 | Shalvi et al. | |
| 2008/0137413 A1 | 6/2008 | Kong et al. | |
| 2008/0148115 A1 | 6/2008 | Sokolov et al. | |
| 2008/0158958 A1 | 7/2008 | Shalvi et al. | |
| 2008/0159059 A1 | 7/2008 | Moyer | |
| 2008/0162079 A1 | 7/2008 | Astigarraga et al. | |
| 2008/0168216 A1 | 7/2008 | Lee | |
| 2008/0168320 A1 | 7/2008 | Cassuto et al. | |
| 2008/0181001 A1 | 7/2008 | Shalvi | |
| 2008/0198650 A1 | 8/2008 | Shalvi et al. | |
| 2008/0198652 A1 | 8/2008 | Shalvi et al. | |
| 2008/0219050 A1 | 9/2008 | Shalvi et al. | |
| 2008/0225599 A1 | 9/2008 | Chae | |
| 2008/0263262 A1 | 10/2008 | Sokolov et al. | |
| 2008/0282106 A1 | 11/2008 | Shalvi et al. | |
| 2008/0285351 A1 | 11/2008 | Shlick et al. | |
| 2008/0301532 A1 | 12/2008 | Uchikawa et al. | |
| 2009/0024905 A1 | 1/2009 | Shalvi et al. | |
| 2009/0043951 A1 | 2/2009 | Shalvi et al. | |
| 2009/0072303 A9 | 3/2009 | Prall et al. | |
| 2009/0091979 A1 | 4/2009 | Shalvi | |
| 2009/0103358 A1 | 4/2009 | Sommer et al. | |
| 2009/0106485 A1 | 4/2009 | Anholt | |
| 2009/0113275 A1 | 4/2009 | Chen et al. | |
| 2009/0125671 A1 | 5/2009 | Flynn et al. | |
| 2009/0144600 A1 | 6/2009 | Perlmutter et al. | |
| 2009/0150748 A1 | 6/2009 | Egner et al. | |
| 2009/0157964 A1 | 6/2009 | Kasorla et al. | |
| 2009/0158126 A1 | 6/2009 | Perlmutter et al. | |

| | | |
|---|---|---|
| 2009/0168524 A1 | 7/2009 | Golov et al. |
| 2009/0187803 A1 | 7/2009 | Anholt et al. |
| 2009/0199074 A1 | 8/2009 | Sommer |
| 2009/0213653 A1 | 8/2009 | Perlmutter et al. |
| 2009/0213654 A1 | 8/2009 | Perlmutter et al. |
| 2009/0228761 A1 | 9/2009 | Perlmutter et al. |
| 2009/0240872 A1 | 9/2009 | Perlmutter et al. |
| 2010/0005270 A1 | 1/2010 | Jiang |
| 2010/0058146 A1 | 3/2010 | Weingarten et al. |
| 2010/0064096 A1 | 3/2010 | Weingarten et al. |
| 2010/0088557 A1 | 4/2010 | Weingarten et al. |
| 2010/0091535 A1 | 4/2010 | Sommer et al. |
| 2010/0095186 A1 | 4/2010 | Weingarten |
| 2010/0110787 A1 | 5/2010 | Shalvi et al. |
| 2010/0115376 A1 | 5/2010 | Shalvi et al. |
| 2010/0122113 A1 | 5/2010 | Weingarten et al. |
| 2010/0124088 A1 | 5/2010 | Shalvi et al. |
| 2010/0131580 A1 | 5/2010 | Kanter et al. |
| 2010/0131806 A1 | 5/2010 | Weingarten et al. |
| 2010/0131809 A1 | 5/2010 | Katz |
| 2010/0131826 A1 | 5/2010 | Shalvi et al. |
| 2010/0131827 A1 | 5/2010 | Sokolov et al. |
| 2010/0131831 A1 | 5/2010 | Weingarten et al. |
| 2010/0146191 A1 | 6/2010 | Katz |
| 2010/0146192 A1 | 6/2010 | Weingarten et al. |
| 2010/0149881 A1 | 6/2010 | Lee et al. |
| 2010/0180073 A1 | 7/2010 | Weingarten et al. |
| 2010/0199149 A1 | 8/2010 | Weingarten et al. |
| 2010/0211724 A1 | 8/2010 | Weingarten |
| 2010/0211833 A1 | 8/2010 | Weingarten |
| 2010/0211856 A1 | 8/2010 | Weingarten |
| 2010/0251066 A1 | 9/2010 | Radke |
| 2010/0253555 A1 | 10/2010 | Weingarten et al. |
| 2010/0257309 A1 | 10/2010 | Barsky et al. |
| 2010/0293321 A1 | 11/2010 | Weingarten |
| 2011/0051521 A1 | 3/2011 | Levy et al. |
| 2011/0055461 A1 | 3/2011 | Steiner et al. |
| 2011/0096612 A1 | 4/2011 | Steiner et al. |
| 2011/0119562 A1 | 5/2011 | Steiner et al. |
| 2011/0153919 A1 | 6/2011 | Sabbag |
| 2011/0161775 A1 | 6/2011 | Weingarten |
| 2011/0214029 A1 | 9/2011 | Steiner et al. |
| 2011/0214039 A1 | 9/2011 | Steiner et al. |
| 2011/0246792 A1 | 10/2011 | Weingarten |
| 2011/0246852 A1 | 10/2011 | Sabbag |
| 2011/0252187 A1 | 10/2011 | Segal et al. |
| 2011/0252188 A1 | 10/2011 | Weingarten |
| 2011/0271043 A1 | 11/2011 | Segal et al. |
| 2011/0302428 A1 | 12/2011 | Weingarten |
| 2012/0001778 A1 | 1/2012 | Steiner et al. |
| 2012/0005554 A1 | 1/2012 | Steiner et al. |
| 2012/0005558 A1 | 1/2012 | Steiner et al. |
| 2012/0005560 A1 | 1/2012 | Steiner et al. |
| 2012/0008401 A1 | 1/2012 | Katz et al. |
| 2012/0008414 A1 | 1/2012 | Katz et al. |
| 2012/0051144 A1 | 3/2012 | Weingarten et al. |
| 2012/0063227 A1 | 3/2012 | Weingarten et al. |
| 2012/0066441 A1 | 3/2012 | Weingarten |
| 2012/0110250 A1 | 5/2012 | Sabbag et al. |

OTHER PUBLICATIONS

Search Report of PCT Patent Application WO 2009/118720 A3.
Search Report of PCT Patent Application WO 2009/095902 A3.
Search Report of PCT Patent Application WO 2009/078006 A3.
Search Report of PCT Patent Application WO 2009/074979 A3.
Search Report of PCT Patent Application WO 2009/074978 A3.
Search Report of PCT Patent Application WO 2009/072105 A3.
Search Report of PCT Patent Application WO 2009/072104 A3.
Search Report of PCT Patent Application WO 2009/072103 A3.
Search Report of PCT Patent Application WO 2009/072102 A3.
Search Report of PCT Patent Application WO 2009/072101 A3.
Search Report of PCT Patent Application WO 2009/072100 A3.
Search Report of PCT Patent Application WO 2009/053963 A3.
Search Report of PCT Patent Application WO 2009/053962 A3.
Search Report of PCT Patent Application WO 2009/053961 A3.
Search Report of PCT Patent Application WO 2009/037697 A3.
Yani Chen, Keshab K. Parhi, "Small Area Parallel Chien Search Architectures for Long BCH Codes", Ieee Transactions on Very Large Scale Integration(VLSI) Systems, vol. 12, No. 5, May 2004.
Yuejian Wu, "Low Power Decoding of BCH Codes", Nortel Networks, Ottawa, Ont., Canada, in Circuits and systems, 2004. ISCAS '04. Proceeding of the 2004 International Symposium on Circuits and Systems, published May 23-26, 2004, vol. 2, pp. II-369-372 vol. 2.
Michael Purser, "Introduction to Error Correcting Codes", Artech House Inc., 1995.
Ron M. Roth, "Introduction to Coding Theory", Cambridge University Press, 2006.
Akash Kumar, Sergei Sawitzki, "High-Throughput and Low Power Architectures for Reed Solomon Decoder", (a.kumar at tue.nl, Eindhoven University of Technology and sergei.sawitzki at philips.com).
Todd K.Moon, "Error Correction Coding Mathematical Methods and Algorithms", A John Wiley & Sons, Inc., 2005.
Richard E. Blahut, "Algebraic Codes for Data Transmission", Cambridge University Press, 2003.
David Esseni, Bruno Ricco, "Trading-Off Programming Speed and Current Absorption in Flash Memories with the Ramped-Gate Programming Technique", Ieee Transactions on Electron Devices, vol. 47, No. 4, Apr. 2000.
Giovanni Campardo, Rino Micheloni, David Novosel, "VLSI-Design of Non-Volatile Memories", Springer Berlin Heidelberg New York, 2005.
John G. Proakis, "Digital Communications", 3rd ed., New York: McGraw-Hill, 1995.
J.M. Portal, H. Aziza, D. Nee, "EEPROM Memory: Threshold Voltage Built in Self Diagnosis", ITC International Test Conference, Paper 2.1.
J.M. Portal, H. Aziza, D. Nee, "EEPROM Diagnosis Based on Threshold Voltage Embedded Measurement", Journal of Electronic Testing: Theory and Applications 21, 33-42, 2005.
G. Tao, A. Scarpa, J. Dijkstra, W. Stidl, F. Kuper, "Data retention prediction for modern floating gate non-volatile memories", Microelectronics Reliability 40 (2000), 1561-1566.
T. Hirncno, N. Matsukawa, H. Hazama, K. Sakui, M. Oshikiri, K. Masuda, K. Kanda, Y. Itoh, J. Miyamoto, "A New Technique for Measuring Threshold Voltage Distribution in Flash EEPROM Devices", Proc. IEEE 1995 Int. Conference on Microelectronics Test Structures, vol. 8, Mar. 1995.
Boaz Eitan, Guy Cohen, Assaf Shappir, Eli Lusky, Amichai Givant, Meir Janai, Ilan Bloom, Yan Polansky, Oleg Dadashev, Avi Lavan, Ran Sahar, Eduardo Maayan, "4-bit per Cell NROM Reliability", Appears on the website of Saifun.com.
Paulo Cappelletti, Clara Golla, Piero Olivo, Enrico Zanoni, "Flash Memories", Kluwer Academic Publishers, 1999.
JEDEC Standard, "Stress-Test-Driven Qualification of Integrated Circuits", JEDEC Solid State Technology Association. JEDEC Standard No. 47F pp. 1-26.
Dempster, et al., "Maximum Likelihood from Incomplete Data via the EM Algorithm", Journal of the Royal Statistical Society. Series B (Methodological), vol. 39, No. 1 (1997), pp. 1-38.
Mielke, et al., "Flash EEPROM Threshold Instabilities due to Charge Trapping During Program/Erase Cycling", IEEE Transactions on Device and Materials Reliability, vol. 4, No. 3, Sep. 2004, pp. 335-344.
Daneshbeh, "Bit Serial Systolic Architectures for Multiplicative Inversion and Division over GF (2)", A thesis presented to the University of Waterloo, Ontario, Canada, 2005, pp. 1-118.
Chen, Formulas for the solutions of Quadratic Equations over GF (2), IEEE Trans. Inform. Theory, vol. IT-28, No. 5, Sep. 1982, pp. 792-794.
Berlekamp et al., "On the Solution of Algebraic Equations over Finite Fields", Inform. Cont. 10, Oct. 1967, pp. 553-564.

* cited by examiner

```
410 ─┤ Micro-controller 110 instructs erasing circuitry 150 to
        erase the sector
```

```
420 ─┤ At about the same time, micro-controller 110 designates at
       least one set (e.g. 172) of representative cells e.g. 20
       representative cells, per erase sector, e.g. 1 representative set
       per erase sector (per-erase sector embodiments of Figs. 2A
       and 2C) or 1 representative set for each page in the erase
       sector (per-page embodiments of Figs. 2B and 2D).
       Designation may comprise reserving the set/s of representative
       cells in the sense that no data is written in them (in controlled
       embodiments of Figs. 2A, 2B) or earmarking certain data cells
       (in "blind" embodiments of Figs. 2C, 2D) in the sense of making
       note of their addresses, typically by reliably storing these e.g.
       at memory locations 240 or 242
```

```
430 ─┤ In controlled embodiments e.g. as per Figs. 2A and 2B,
       micro-controller 110 loads the reserved representative
       cells 172 or 220 by instructing writing circuitry 160 to
       write, in each of the set of representative cells,
       predetermined physical levels such as all (typically
       manufacturer-determined) central values e.g. C0, ... C3
       or such as only the maximum central value such as C3 in
       the example of Fig. 1 which may be 5V or any other
       manufacturer-determined value.
```

```
435 ─┤ Micro-controller 110 stores, in a high-reliability location e.g.
       statistics cells 174, 210 or 212, at least one central
       characteristic of the physical levels stored in each set of
       representative cells e.g. central tendency (mean (M_erase),
       median, or mode) and/or standard deviation
```

FIG. 3B

610 — Direct physical value deterioration estimation unit 190 computes at least one current central characteristic, e.g. mean (or median or mode) of current charge values in the erase sector's representative set, M_read (Figs. 2A, 2C) or M_read_j (Figs. 2B, 2D); this may be stored in temporary memory of the micro-controller 110.

620 — Direct physical value deterioration estimation unit 190 computes a proportion (threshold attenuation factor) M_read/M_write for the entire erase sector (per-erase sector embodiments of Figs. 2A, 2C)) or M_read_j/M_write_j for each page therewithin (per-page embodiments of Figs. 2B, 2D)

630 — For the entire erase sector (per-erase sector embodiments of Figs. 2A, 3C) or for each page therewithin (per page embodiments of Figs. 2B, 2D), systematic read-threshold determination unit 180 defines a current sequence of read thresholds T_READ_0, T_READ_1, T_READ_2, T_READ_3, T_READ_4

FIG. 3D

| Year=10 | ...... | ...... | Year=3 | Year=2 | Year=1 | Variance (mV^2) |
|---|---|---|---|---|---|---|
| 200 | | | | 110 | 100 | Cycle=100 |
| | | | | 210 | 200 | Cycle=200 |
| | | | | | | |
| | | | | | | |
| 1200 | | | | 1010 | 1000 | Cycle=1000 |

FIG. 8A

| Year=10 | ......... | ......... | Year=1 | Level settings (V) T1, T2, T3 |
|---|---|---|---|---|
| -0.1, 1.9, 3.8 | | | 0, 2, 4 | Cycle=100 |
| | | | | Cycle=200 |
| | | | | |
| | | | | |
| -0.5, 1.7, 3.5 | | | | Cycle=1000 |

FIG. 8B

FLASH MEMORY DEVICE WITH PHYSICAL CELL VALUE DETERIORATION ACCOMMODATION AND METHODS USEFUL IN CONJUNCTION THEREWITH

CROSS-REFERENCE TO RELATED APPLICATIONS

This application is a National Phase Application of PCT International Application No. PCT/IL2008/001239, entitled "FLASH MEMORY DEVICE WITH PHYSICAL CELL VALUE DETERIORATION ACCOMMODATION AND METHODS USEFUL IN CONJUNCTION THEREWITH", International Filing Date Sep. 17, 2008, published on Jun. 11, 2009 as International Publication No. WO 2009/072104, which in turn claims priority from U.S. Provisional Patent Application No. 60/996,782, filed Dec. 5, 2007 and entitled "Systems and Methods for Using a Training Sequence in Flash Memory", U.S. Provisional Patent Application No. 61/064,853, filed Mar. 31, 2008 and entitled "Flash Memory Device with Physical Cell Value Deterioration Accommodation and Methods Useful in Conjunction Therewith", U.S. Provisional Patent Application No. 61/006,805, filed Jan. 31, 2008 and entitled "A Method for Extending the Life of Flash Devices", U.S. Provisional Patent Application No. 61/071,465, filed Apr. 30, 2008 and entitled "Systems and Methods for Temporarily Retiring Memory Portions" and U.S. Provisional Patent Application No. 61/129,608, filed Jul. 8, 2008 and entitled "A Method for Acquiring and Tracking Detection Thresholds in Flash Devices", all of which are incorporated herein by reference in their entirety.

Other applications include: U.S. Provisional Application No. 60/960,207, filed Sep. 20, 2007 and entitled "Systems and Methods for Coupling Detection in Flash Memory", U.S. Provisional Application No. 61/071,467, filed Apr. 30, 2008 and entitled "Improved Systems and Methods for Determining Logical Values of Coupled Flash Memory Cells", U.S. Provisional Application No. 60/960,943, filed Oct. 22, 2007 and entitled "Systems and methods to reduce errors in Solid State Disks and Large Flash Devices" and U.S. Provisional Application No. 61/071,469, filed Apr. 30, 2008 and entitled "Systems and Methods for Averaging Error Rates in Non-Volatile Devices and Storage Systems", U.S. Provisional Application No. 60/996,027, filed Oct. 25, 2007 and entitled "Systems and Methods for Coping with Variable Bit Error Rates in Flash Devices", U.S. Provisional Application No. 61/071,466, filed Apr. 30, 2008 and entitled "Systems and Methods for Multiple Coding Rates in Flash Devices", U.S. Provisional Application No. 61/006,120, filed Dec. 19, 2007 and entitled "Systems and Methods for Coping with Multi Stage Decoding in Flash Devices", U.S. Provisional Application No. 61/071,464, filed Apr. 30, 2008 and entitled "A Decoder Operative to Effect A Plurality of Decoding Stages Upon Flash Memory Data and Methods Useful in Conjunction Therewith", U.S. Provisional Application No. 61/006,385, filed Jan. 10, 2008 and entitled "A System for Error Correction Encoder and Decoder Using the Lee Metric and Adapted to Work on Multi-Level Physical Media", U.S. Provisional Application No. 61/064,995, filed Apr. 8, 2008 and entitled "Systems and Methods for Error Correction and Decoding on Multi-Level Physical Media", U.S. Provisional Application No. 60/996,948, filed Dec. 12, 2007 and entitled "Low Power BCH/RS Decoding: a Low Power Chien-Search Implementation", U.S. Provisional Application No. 61/071,487, filed May 1, 2008 and entitled "Chien-Search System Employing a Clock-Gating Scheme to Save Power for Error Correction Decoder and other Applications", U.S. Provisional Application No. 61/071,468, filed Apr. 30, 2008 and entitled "A Low Power Chien-Search Based BCH/RS Recoding System for Flash Memory, Mobile Communications Devices and Other Applications", U.S. Provisional Application No. 61/006,806, filed Jan. 31, 2008 and entitled "Systems and Methods for using a Erasure Coding in Flash memory", U.S. Provisional Application No. 61/071,486, filed May 1, 2008 and entitled "Systems and Methods for Handling Immediate Data Errors in Flash Memory", U.S. Provisional Application No. 61/006,078, filed Dec. 18, 2007 and entitled "Systems and Methods for Multi Rate Coding in Multi Level Flash Devices", U.S. Provisional Application No. 61/064,923, filed Apr. 30, 2008 and entitled "Apparatus For Coding At A Plurality Of Rates In Multi-Level Flash Memory Systems, And Methods Useful In Conjunction Therewith", U.S. Provisional Application No. 61/064,760, filed Mar. 25, 2008 and entitled "Hardware efficient implementation of rounding in fixed-point arithmetic", U.S. Provisional Application No. 61/071,404, filed Apr. 28, 2008 and entitled "Apparatus and Methods for Hardware-Efficient Unbiased Rounding", U.S. Provisional Application No. 61/136,234, filed Aug. 20, 2008 and entitled "A Method Of Reprogramming A Non-Volatile Memory Device Without Performing An Erase Operation", U.S. Provisional Application No. 61/129,414, filed Jun. 25, 2008 and entitled "Improved Programming Speed in Flash Devices Using Adaptive Programming", and several other co-pending patent applications being filed concurrently (same day).

FIELD OF THE INVENTION

The present invention relates generally to flash memory devices and more particularly to generating threshold values for use when reading flash memory devices.

BACKGROUND OF THE INVENTION

A variety of conventional flash memory devices are described in the following US patents and patent documents: U.S. Pat. Nos. 6,751,766; 7,196,946; 7,203,874; US 2006/0101193 A1; US 2007/0180346 A1.

The state of the art is believed to be described by the following publications inter alia:
[1] "Interleaving policies for flash memory", United States Patent 20070168625
[2] "Minimization of FG-FG coupling in flash memory", U.S. Pat. No. 6,996,004
[3] Construction of Rate (n−1)/n Punctured Convolution Code with Minimum Required SNR Criterion, Pil J. Lee, IEEE Trans. On Comm. Vol. 36, NO. 10, October 1988
[4] "Introduction to Coding Theory", Ron M. Roth, Cambridge University Press, 2006, particularly chapters 5 and 8 re BCH.

The disclosures of all publications and patent documents mentioned in the specification, and of the publications and patent documents cited therein directly or indirectly, are hereby incorporated by reference.

SUMMARY OF THE INVENTION

Nowadays, flash memory devices store information with high density on Flash cells with ever-decreasing dimensions. In addition, Multi-Level Cells (MLC) store several bits per cell by setting the amount of charge in the cell. The amount of charge is then measured by a detector, calculated by a threshold voltage of the transistor gate. Due to inaccuracies during the programming procedure and charge loss due to time and temperature (also known as retention), the measured levels during a Read operation suffer from detection errors. The small dimensions of the Flash cells result in cells that can store very small amounts of charge, enhancing the effects of inaccuracies due to programming and retention. Thus, new single level cells (SLC) and Multi-Level Cell (MLC) devices have significantly increased bit error rate (BER), decreasing the reliability of the device.

Flash devices are organized into (physical) pages. Each page contains a section allocated for data (512 bytes-4K bytes) and a small number of bytes (16-32 bytes for every 512 data bytes) dedicated to redundancy and management information. The redundancy bytes are used to store error correcting information, for correcting errors which may have occurred up to and during the page Read. Each Read operation and each Write operation is performed on an entire page. A number of pages are grouped together to form an Erase Block (EB). A page cannot be erased unless the entire erase block which contains it is erased.

An important measure of a Flash device quality is the number of times (Np) it may be reprogrammed and the period (usually 10 years) that it can store data before irrecoverable errors occur. The higher the number of program-erase cycles, the higher the bit error rate. Thus, today's Multi-Level Cell (MLC) devices can perform around Np=1000 cycles for 10 year retention before the allocation of 16-32 bytes of redundancy per 512 bytes of data bytes becomes insufficient to correct errors. Single level cell (SLC) devices usually perform better but obtain a much lower density and hence their prices are much higher. Following Np program-erase cycles the device is still operational but the bit error rate is higher. Furthermore, in many devices (e.g. NROM Flash devices), this behavior is predictable and it can be shown that the number of redundancy bytes required to correct these errors does not jump rapidly.

The reliability of a specific page or erase block is not known because, among others, the retention time is not known prior to reading, hence the decoding parameters are not known. Using a single decoding scheme may result in poor read performance (read time and power consumption). The ECC complexity may be designed for the end of life conditions and may force higher complexity decoding for pages that are more reliable or at the beginning of life.

Certain embodiments of the present invention seek to provide an improved flash memory device and improved methods for determining thresholds for use in reading from cells of the device. In some embodiments of the present invention, a set of representative cells is designated for monitoring deterioration, relative to highly reliable cells which store statistics (e.g. mean and/or standard deviation or even raw values) of the set of representative cells as originally programmed i.e. before deterioration. Cells may be adapted to be reliable e.g. by using them as single level cells and/or by using high-level error correction code. The set of representative cells may be set aside and not used for data ('controlled' embodiments) or the set of representative cells is not set aside; instead, the representative cells are pre-designated ("earmarked") ones from among the normal data cells and are used throughout to store normal, uncontrolled data ("blind" embodiments).

In some embodiments, only one set of representative cells is designated for each erase sector, as opposed to embodiments in which each and every page in the erase sector has its own set of representative cells. In the former, per-erase sector embodiments, typically, a reliably stored indicator ("offset cell") in each page indicates the interval of time which elapsed between the programming of the per-erase sector representative cells and the programming of the page in question, thereby allowing retention time between the programming of a certain page and its reading to be obtained. Alternatively, in certain applications, all pages in each erase sector may be programmed at approximately the same time.

It is appreciated that optionally, typically to save memory which may be required for storing representative cell location information, representative cells may be provided at a uniform, predetermined location within each page or each erase sector, such as at the beginning of each page, or at the beginning of each first page in each erase sector.

In controlled embodiments, the representative cells may be programmed with only a few levels, perhaps even only one. They are then read with high accuracy, which is generally time-consuming, in order to compute and store a deterioration-affected statistic thereof such as but not limited to a mean. Alternatively, to save reading time, the representative cells may be programmed with a more complex "ramp" or range of almost continuous values corresponding in size to the maximum extent of deterioration. For example, if the flash memory device is intended for use over a 10 year period over which the deterioration that may be expected to occur is 0.5 V at most, a range of values from 0 V to 0.5 V may be programmed into the representative cells. When reading takes place, it is then only necessary to determine how many of the cells lie below a certain value as opposed to above, however, the "ramp" embodiment may require more representative cells than its alternative.

Representative cells may be used to determine reading thresholds for each reading operation, so as to take into account the deterioration which may have taken place up until the time at which an individual reading operation happens to be taking place. For example, current values in the representative cells may be compared to the mean or other deterioration affected statistic of the representative cells which has been stored in reliable cells since the time of writing. The ratio between current and reliably stored statistics may be multiplied by an original reading threshold to obtain a new reading threshold which adapts to the deterioration that has occurred since the original threshold was determined. Alternatively, the representative cells may be used to compute a deterioration affected statistic such as a mean and a look up table may be used that associates this statistic with a retention time. Another look up table is used to return a set of new threshold values, for each retention time value obtained from the first table and each number of program/erase cycles.

Flash memory device cells are conventionally divided into 3 types:
1. Data cells: store the information for which the flash memory is being employed in the first place.
2. Management cells: store control information conventionally used by the micro-controller, such as Back pointers, ECC redundancy, back pointers, set of representative cells, training statistics, and training offset.
3. On-Time-Programming (OTP) cells: A set of constants determined in the course of production of the flash memory and conventionally used by the micro-controller 110, such as page size, representative base statistics, look-up tables.

There is thus provided, in accordance with at least one embodiment of the present invention, a method for converting a measured physical level of a cell into a logical value, in an array of memory cells storing physical levels which diminish over time, the method comprising determining extent of deterioration of the physical levels and determining thresholds accordingly for at least an individual cell in the array; and reading the individual cell including reading a physical level in said cell and converting said physical level into a logical value using at least some of said thresholds, wherein said determining extent of deterioration comprises storing predefined physical levels rather than data-determined physical levels in each of a plurality of cells and determining extent of deterioration by computing deterioration of said predefined physical levels.

It is appreciated that reading need not take place immediately after threshold determination. In general the order of operations and duration of time elapsing between operations shown and described herein is not intended to be limiting and can be determined at will in accordance with the particular demands of each application.

Further in accordance with at least one embodiment of the present invention, the predefined physical levels are maximum physical levels.

Still further in accordance with at least one embodiment of the present invention, determining extent of deterioration comprises determining deterioration of said predefined physical levels and assuming that said deterioration is a known function of said physical levels.

Additionally in accordance with at least one embodiment of the present invention, the known function comprises a linear function.

Still further in accordance with at least one embodiment of the present invention, storing comprises storing said predefined physical levels in cells whose reliability is no different than the reliability of those cells in the array which are not used for storing said predefined physical levels.

Further in accordance with at least one embodiment of the present invention, said array comprises more than one erase sector, each of which includes a subset of cells which together undergo cycles affecting said extent of deterioration; and wherein said determining of said extent of deterioration is performed no more than once per erase sector.

Still further in accordance with at least one embodiment of the present invention, the array of digital memory cells comprises a plurality of pages characterized in that the cells within each page are written onto as a single operation and wherein said determining is performed no more than once per page.

Also provided, in accordance with at least one embodiment of the present invention, is a method for determining thresholds useful for converting cell physical levels into cell logical values in an array of digital memory cells storing physical levels which diminish over time, the method comprising determining extent of deterioration of the physical levels and determining thresholds accordingly for at least an individual cell in said array; and reading said individual cell including using reading a physical level in said cell and converting said physical level into a logical value using said thresholds.

Further in accordance with at least one embodiment of the present invention, determining comprises computing extent of deterioration by determining deterioration of said predefined physical levels in each of a plurality of cells.

Still further in accordance with at least one embodiment of the present invention, reading comprises binary reading and wherein said predefined physical levels comprise an ascending sequence of physical levels.

Further in accordance with at least one embodiment of the present invention, the ascending sequence is evenly spaced.

Still further in accordance with at least one embodiment of the present invention, the array comprises more than one erase sector, each of which includes a subset of cells which together undergo cycles affecting said extent of deterioration; wherein said determination of extent of deterioration comprises storing predefined physical levels rather than data physical levels in each of a plurality of cells and wherein said storing is performed no more than once per erase sector.

Further in accordance with at least one embodiment of the present invention, the physical levels comprise charge levels.

Also provided, in accordance with at least one embodiment of the present invention, is a computer program product comprising a computer useable medium having computer readable program code having embodied therein a method for determining thresholds useful for converting cell physical levels into cell logical values in an array of memory cells storing physical levels which diminish over time, said computer program product comprising computer readable program code for determining extent of deterioration of the physical levels and determining thresholds accordingly for at least an individual cell in said array; and reading said individual cell including using reading a physical level in said cell and converting said physical level into a logical value using said thresholds, wherein said determining comprises storing predefined physical levels rather than data-determined physical levels in each of a plurality of cells and computing extent of deterioration by determining deterioration of said predefined physical levels.

Also provided, in accordance with still another embodiment of the present invention, is a system for determining thresholds useful for converting cell physical levels into cell logical values in an array of memory cells storing physical levels which diminish over time, the system comprising deterioration determining apparatus determining extent of deterioration of the physical levels and determining thresholds accordingly for at least an individual cell in said array; and reading circuitry operative to read said individual cell including reading a physical level in said cell and converting said physical level into a logical value using said thresholds, wherein said deterioration determining apparatus is operative to store predefined physical levels rather than data-determined physical levels in each of a plurality of cells and to compute extent of deterioration by determining deterioration of said predefined physical levels.

Still further provided, in accordance with yet another embodiment of the present invention, is a method for determining thresholds useful for converting cell physical levels into cell logical values in an array of memory cells storing physical levels which diminish over time, the method comprising determining extent of deterioration of the physical levels by comparing at least a central tendency of previous physical levels with at least a central tendency of current physical levels and determining thresholds accordingly for at least an individual cell in said array; and reading said individual cell including reading a physical level in said cell and converting said physical level into a logical value using said thresholds.

Also provided, in accordance with another embodiment of the present invention, is a method for determining thresholds useful for converting cell physical levels into cell logical values in an array of memory cells storing physical levels which diminish over time, the method comprising determining extent of deterioration of the physical levels and systematically determining thresholds accordingly for at least an individual cell in said array; and reading said individual cell including reading a physical level in said cell and converting said physical level into a logical value using said thresholds.

Further in accordance with at least one embodiment of the present invention, the systematic determination of thresholds comprises computation of thresholds.

Still further in accordance with at least one embodiment of the present invention, said computation assumes linearity of deterioration throughout the range of physical levels stored in individual cells in said array.

Additionally in accordance with at least one embodiment of the present invention, said computation does not assume linearity of deterioration throughout the range of physical levels stored in individual cells in said array.

Further in accordance with at least one embodiment of the present invention, said systematic determination of thresholds comprises use of a look-up table.

Also provided, in accordance with yet another embodiment of the present invention, is a method for determining thresholds useful for converting cell physical levels into cell logical values in an array of memory cells storing physical levels which diminish over time, the method comprising determining extent of deterioration of the physical levels and determining thresholds accordingly for at least an individual cell in said array; and reading said individual cell including reading a physical level in said cell and converting said physical level into a logical value using said thresholds, wherein said determining comprises reliably storing at least a central tendency of only a subset of original physical values of said array of memory cells and computing extent of deterioration by comparing, generally at the same time as reading, at least said central tendency of said subset of original physical values to at least a central tendency of corresponding current physical values.

Further in accordance with at least one embodiment of the present invention, determining extent of deterioration comprises determining deterioration of said predefined physical levels and assuming a known function of deterioration as a function of program/erase cycle number.

Still further in accordance with at least one embodiment of the present invention, determining extent of deterioration comprises determining deterioration of said predefined physical levels and assuming a known function of deterioration as a function of address of said predefined physical levels.

Also provided, in accordance with at least one embodiment of the present invention, is a computer program product comprising a computer useable medium having computer readable program code having embodied therein a method for determining thresholds useful for converting cell physical levels into cell logical values in an array of memory cells storing physical levels which diminish over time, said computer program product comprising computer readable program code for determining extent of deterioration of the physical levels and determining thresholds accordingly for at least an individual cell in said array; and reading said individual cell including using reading a physical level in said cell and converting said physical level into a logical value using said thresholds.

Further provided, in accordance with at least one embodiment of the present invention, is a computer program product comprising a computer useable medium having computer readable program code having embodied therein a method for determining thresholds useful for converting cell physical levels into cell logical values in an array of memory cells storing physical levels which diminish over time, said computer program product comprising computer readable program code for determining extent of deterioration of the physical levels by comparing at least a central tendency of previous physical levels with at least a central tendency of current physical levels and determining thresholds accordingly for at least an individual cell in said array; and reading said individual cell including reading a physical level in said cell and converting said physical level into a logical value using said thresholds.

Also provided, in accordance with at least one embodiment of the present invention, is a computer program product comprising a computer useable medium having computer readable program code having embodied therein a method for determining thresholds useful for converting cell physical levels into cell logical values in an array of memory cells storing physical levels which diminish over time, said computer program product comprising computer readable program code for determining extent of deterioration of the physical levels and systematically determining thresholds accordingly for at least an individual cell in said array; and reading said individual cell including reading a physical level in said cell and converting said physical level into a logical value using said thresholds.

Additionally provided, in accordance with at least one embodiment of the present invention, is a computer program product comprising a computer useable medium having computer readable program code having embodied therein a method for determining thresholds useful for converting cell physical levels into cell logical values in an array of memory cells storing physical levels which diminish over time, said computer program product comprising computer readable program code for determining extent of deterioration of the physical levels and determining thresholds accordingly for at least an individual cell in said array; and reading said individual cell including reading a physical level in said cell and converting said physical level into a logical value using said thresholds, wherein said determining comprises reliably storing at least a central tendency of only a subset of original physical values of said array of memory cells and computing extent of deterioration by comparing, generally at the same time as reading, at least said central tendency of said subset of original physical values to at least a central tendency of corresponding current physical values.

Further provided, in accordance with still another embodiment of the present invention, is a system for determining thresholds useful for converting cell physical levels into cell logical values in an array of memory cells storing physical levels which diminish over time, the system comprising deterioration determining apparatus determining extent of deterioration of the physical levels and determining thresholds accordingly for at least an individual cell in said array; and reading circuitry operative to read said individual cell including reading a physical level in said cell and converting said physical level into a logical value using said thresholds, wherein said array comprises more than one erase sectors, each of which including a subset of cells which together undergo cycles affecting said extent of deterioration; wherein said deterioration determining apparatus comprises apparatus for storing predefined physical levels rather than data physical levels in each of a plurality of cells, the apparatus for storing being characterized in that said storing is performed no more than once per erase sector.

Further provided, in accordance with at least one embodiment of the present invention, is a system for determining thresholds useful for converting cell physical levels into cell logical values in an array of memory cells storing physical levels which diminish over time, the system comprising deterioration determining apparatus determining extent of deterioration of the physical levels by comparing at least a central tendency of previous physical levels with at least a central tendency of current physical levels and determining thresholds accordingly for at least an individual cell in said array; and reading circuitry operative to read said individual cell including reading a physical level in said cell and converting said physical level into a logical value using said thresholds.

Also provided, in accordance with at least one embodiment of the present invention, is a system for determining thresholds useful for converting cell physical levels into cell logical values in an array of memory cells storing physical levels which diminish over time, the system comprising deterioration determining apparatus determining extent of deterioration of the physical levels and systematically determining thresholds accordingly for at least an individual cell in said array; and reading circuitry operative to read said individual cell including reading a physical level in said cell and converting said physical level into a logical value using said thresholds.

Further provided, in accordance with at least one embodiment of the present invention, is a system for determining thresholds useful for converting cell physical levels into cell logical values in an array of memory cells storing physical levels which diminish over time, the system comprising deterioration determining apparatus determining extent of deterioration of the physical levels and determining thresholds accordingly for at least an individual cell in said array; and reading circuitry operative to read said individual cell including reading a physical level in said cell and converting said physical level into a logical value using said thresholds, wherein said deterioration determining apparatus is operative to reliably store at least a central tendency of only a subset of original physical values of said array of memory cells and compute extent of deterioration by comparing, generally at the same time as reading circuitry read, at least said central tendency of said subset of original physical values to at least a central tendency of corresponding current physical values.

Further in accordance with at least one embodiment of the present invention, said plurality of cells comprises a number of cells selected to as to achieve a level of reading errors which does not exceed a predetermined acceptable level.

Still further in accordance with at least one embodiment of the present invention, reading comprises using error correction code to eliminate errors and wherein said predetermined acceptable level comprises a predetermined maximum proportion of pages containing so many errors as to be uncorrectable by said error correction code.

Additionally in accordance with at least one embodiment of the present invention, determining extent of deterioration is performed no more than once per erase sector and said threshold determining is performed once for each of a plurality of pages included in each erase sector.

Further in accordance with at least one embodiment of the present invention, said array comprises more than one erase sector, each of which includes a subset of cells which together undergo cycles affecting said extent of deterioration; wherein said determining extent of deterioration comprises storing predefined physical levels rather than data physical levels in each of a plurality of cells and wherein said storing is performed no more than once per erase sector.

Also provided, in accordance with at least one embodiment of the present invention, is a method for using an array of memory cells storing physical levels which diminish over time, the method comprising determining extent of deterioration of the physical levels; and using said array of memory cells so as to take into account said extent of deterioration.

The following terms may be construed either in accordance with any definition thereof appearing in the prior art literature or in accordance with the specification, or as follows:

Block: a set of flash memory device cells which must, due to physical limitations of the flash memory device, be erased together. Also termed erase sector, erase block.

Cell: A component of flash memory that stores one bit of information (in single-level cell devices) or n bits of information (in a multi-level device having $2^n$ levels). Typically, each cell comprises a floating-gate transistor. n may or may not be an integer. "Multi-level" means that the physical levels in the cell are, to an acceptable level of certainty, statistically pardonable into multiple distinguishable regions, plus a region corresponding to zero, such that digital values each comprising multiple bits can be represented by the cell. In contrast, in single-level cells, the physical levels in the cell are assumed to be statistically partitionable into only two regions, one corresponding to zero and one other, non-zero region, such that only one bit can be represented by a single-level cell.

Charge level: the measured voltage of a cell which reflects its electric charge.

Cycling: Repeatedly writing new data into flash memory cells and repeatedly erasing the cells between each two writing operations.

Decision regions: Regions extending between adjacent decision levels, e.g. if decision levels are 0, 2 and 4 volts respectively, the decision regions are under 0 V, 0 V-2 V, 2V-4 V, and over 4 V.

Demapping: basic cell-level reading function in which a digital n-tuple originally received from an outside application is derived from a physical value representing a physical state in the cell having a predetermined correspondence to the digital n-tuple.

Digital value or "logical value": n-tuple of bits represented by a cell in flash memory capable of generating $2^n$ distinguishable levels of a typically continuous physical value such as charge, where n may or may not be an integer.

Erase cycle: The relatively slow process of erasing a block of cells (erase sector), each block typically comprising more than one page, or, in certain non-flash memory devices, of erasing a single cell or the duration of so doing. An advantage of erasing cells collectively in blocks as in flash memory, rather than individually, is enhanced programming speed: Many cells and typically even many pages of cells are erased in a single erase cycle.

Erase-write cycle: The process of erasing a block of cells (erase sector), each block typically comprising a plurality of pages, and subsequently writing new data into at least some of them. The terms "program" and "write" are used herein generally interchangeably.

Flash memory: Non-volatile computer memory including cells that are erased block by block, each block typically comprising more than one page, but are written into and read from, page by page. Includes NOR-type flash memory, NAND-type flash memory, and PRAM, e.g. Samsung PRAM, inter alia, and flash memory devices with any suitable number of levels per cell, such as but not limited to 2, 4, or (as in the embodiment illustrated herein) 8.

Mapping: basic cell-level writing function in which incoming digital n-tuple is mapped to a program level by inducing a program level in the cell, having a predetermined correspondence to the incoming logical value.

Page=A portion, typically 512 or 2048 or 4096 bytes in size, of a flash memory e.g. a NAND or NOR flash memory device. Writing can be performed page by page, as opposed to erasing which can be performed only erase sector by erase sector. A few bytes, typically 16-32 for every 512 data bytes are associated with each page (typically 16, 64 or 128 per page), for storage of error correction information. A typical block may include 32 512-byte pages or 64 2048-byte pages.

Precise read, soft read: Cell threshold voltages are read at a precision (number of bits) greater than the number of Mapping levels ($2^n$). The terms precise read or soft read are interchangeable. In contrast, in "hard read", cell threshold voltages are read at a precision (number of bits) smaller than the number of Mapping levels ($2^n$ where n=number of bits per cell).

Present level, Charge level: The amount of charge in the cell. The amount of charge currently existing in a cell, at the present time, as opposed to "program level", the amount of charge originally induced in the cell (i.e. at the end of programming).

Program: same as "write".

Program level (programmed level, programming level): amount of charge originally induced in a cell to represent a given logical value, as opposed to "present level".

Reprogrammability (Np): An aspect of flash memory quality. This is typically operationalized by a reprogrammability parameter, also termed herein "Np", denoting the number of times that a flash memory can be re-programmed (number of erase-write cycles that the device can withstand) before the level of errors is so high as to make an unacceptably high proportion of those errors irrecoverable given a predetermined amount of memory devoted to redundancy. Typically recoverability is investigated following a conventional aging simulation process which simulates or approximates the data degradation effect that a predetermined time period e.g. a 10 year period has on the to flash memory device, in an attempt to accommodate for a period of up to 10 years between writing of data in flash memory and reading of the data therefrom.

Resolution: Number of levels in each cell, which in turn determines the number of bits the cell can store; typically a cell with $2^n$ levels stores n bits. Low resolution (partitioning the window, W, of physical values a cell can assume into a small rather than large number of levels per cell) provides high reliability.

Retention: of original physical levels induced in the cells; retention is typically below 100% resulting in deterioration of original physical levels into present levels.

Retention time: The amount of time that data has been stored in a flash device, typically without, or substantially without, voltage having been supplied to the flash device i.e. the time which elapses between programming of a page and reading of the same page.

Symbol: Logical value

Threshold level: the voltage (e.g.) against which the charge level of a cell is measured. For example, a cell may be said to store a particular digital n-tuple D if the charge level or other physical level of the cell falls between two threshold values T.

Unless specifically stated otherwise, as apparent from the following discussions, it is appreciated that throughout the specification discussions, utilizing terms such as, "processing", "computing", "selecting", "ranking", "grading", "calculating", "determining", "generating", "reassessing", "classifying", "generating", "producing", "stereo-matching", "registering", "detecting", "associating", "superimposing", "obtaining" or the like, refer to the action and/or processes of a computer or computing system, or processor or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

In this specification, the terms "decision levels" and "threshold levels" are used interchangeably. "Reliably storing" and "reliable" are used to indicate that certain information is stored with high reliability in the sense that it can be expected to be read without error throughout the guaranteed lifetime of the flash memory device.

Any suitable processor, display and input means may be used to process, display, store and accept information, including computer programs, in accordance with some or all of the teachings of the present invention, such as but not limited to a conventional personal computer processor, workstation or other programmable device or computer or electronic computing device, either general-purpose or specifically constructed, for processing; a display screen and/or printer and/or speaker for displaying; machine-readable memory such as optical disks, CDROMs, magnetic-optical discs or other discs; RAMs, ROMs, EPROMs, EEPROMs, magnetic or optical or other cards, for storing, and keyboard or mouse for accepting. The term "process" as used above is intended to include any type of computation or manipulation or transformation of data represented as physical, e.g. electronic, phenomena which may occur or reside e.g. within registers and/or memories of a computer.

The above devices may communicate via any conventional wired or wireless digital communication means, e.g. via a wired or cellular telephone network or a computer network such as the Internet.

The apparatus of the present invention may include, according to certain embodiments of the invention, machine readable memory containing or otherwise storing a program of instructions which, when executed by the machine, implements some or all of the apparatus, methods, features and functionalities of the invention shown and described herein. Alternatively or in addition, the apparatus of the present invention may include, according to certain embodiments of the invention, a program as above which may be written in any conventional programming language, and optionally a machine for executing the program such as but not limited to a general purpose computer which may optionally be configured or activated in accordance with the teachings of the present invention.

Any trademark occurring in the text or drawings is the property of its owner and occurs herein merely to explain or illustrate one example of how an embodiment of the invention may be implemented.

BRIEF DESCRIPTION OF THE DRAWINGS

Certain embodiments of the present invention are illustrated in the following drawings:

FIG. 2A illustrates a controlled, per-erase sector embodiment, FIG. 2B illustrates a controlled, per-page embodiment, FIG. 2C illustrates a blind, per-erase sector embodiment and FIG. 2D illustrates a blind, per-page embodiment;

FIG. 3B is a simplified flowchart illustration of a method for performing step 340 of FIG. 3A, in accordance with certain embodiments of the present invention;

FIG. 3D is a simplified flowchart illustration of a method for performing step 360 of FIG. 3A, in accordance with certain embodiments of the present invention;

FIGS. 8A-8B are examples of look-up tables useful in generating read thresholds adapted to the effective age of a flash memory device as affected by the retention and cycling undergone by the device, according to certain embodiments of the present invention.

DETAILED DESCRIPTION OF CERTAIN EMBODIMENTS

Figure 1:
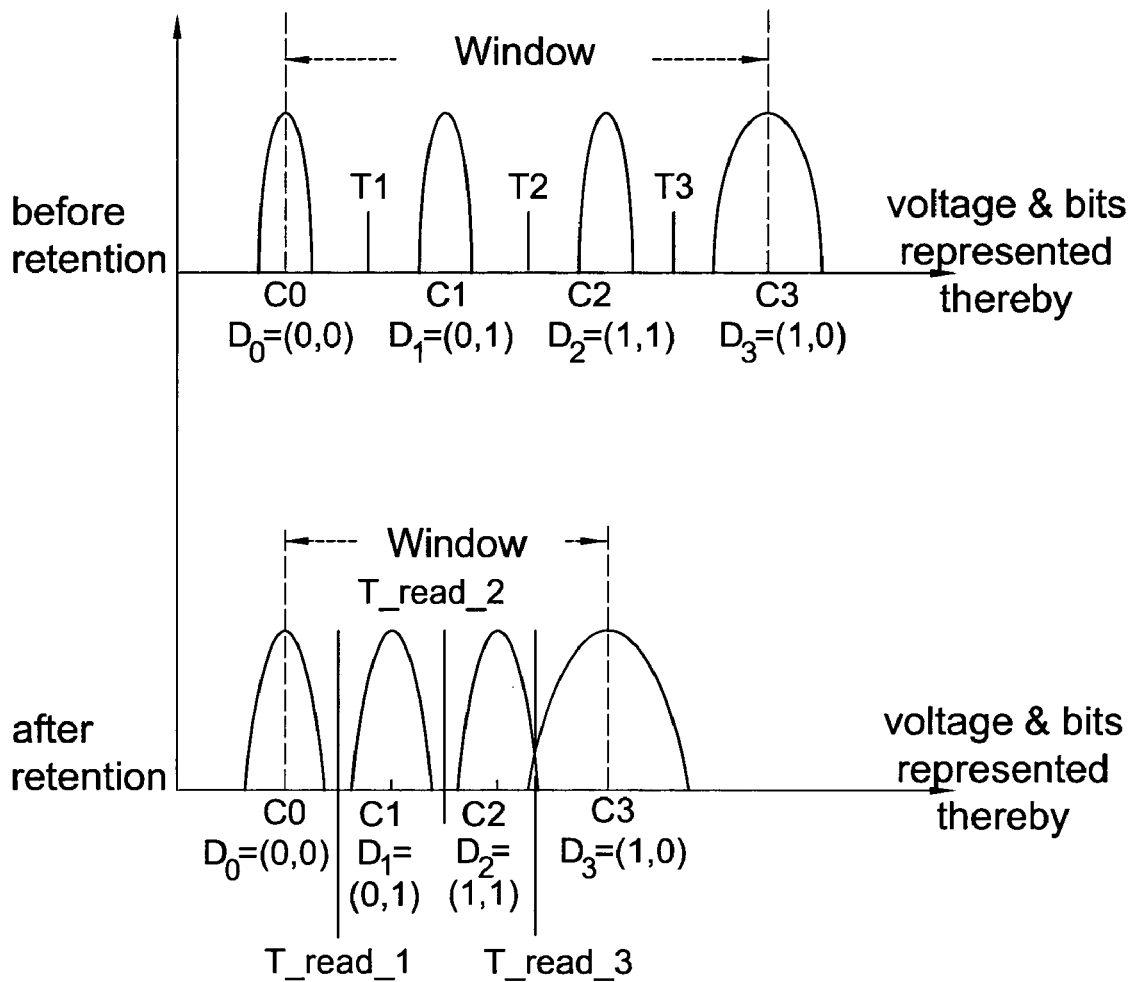
FIG. 1 is a graph (top) of manufacturer-defined initial cell voltage distributions, which apply to a flash memory device which has yet to undergo cycling and retention vs. a graph (bottom) of cell voltage distributions which apply to a flash memory device which has undergone cycling and retention.

Reference is now made to FIG. 1 which is a graph (top) of manufacturer-defined initial cell voltage distributions, which apply to a flash memory device which has yet to undergo cycling and retention vs. a graph (bottom) of cell voltage distributions which apply to a flash memory device which has undergone cycling and retention.

A read threshold, T* (also termed herein T_read) is used to distinguish between each two adjacent programming charge levels. Generally these two charge levels comprise physical values clustering normally around a first charge C_1, and physical values clustering normally around a second charge level C_2.

As described in detail below, T_read may be computed by dedicating a first subset of the representative cells, comprising at least one and typically several representative cells, to storing C_1. A second subset of the representative cells, comprising at least one and typically several representative cells is dedicated to storing C_2. These two subsets can be used to compute the read threshold level when it is desired to read, e.g. using the following formula also termed herein the "read-threshold computation formula", where the means and standard deviations of the first and second subsets are represented by m and sigma respectively, and suitable subscripts 1 or 2:

$$T_i^* = \frac{\sigma_{i-1} m_i + \sigma_i m_{i-1}}{(\sigma_{i-1} + \sigma_i)}$$

m—mean
σ—standard deviation

The above formula computes the reading threshold as a weighted average of the mean present values in the two subsets, weighted by the standard deviations of the two subsets. Optionally, the reading threshold as computed above may be further adjusted to take into account coupling between adjacent cells. It is appreciated that the mean and standard deviation of adjacent levels may be estimated using the representative cells. If the standard deviation is equal for all levels, the optimal decision level may be computed as a simple average between two adjacent means.

Various embodiments for computing read thresholds are described hereinbelow in detail.

Reference is now made to FIGS. 2A-2D which are simplified functional block diagrams of an improved flash memory system with adjustable read thresholds, constructed and operative in accordance with certain embodiments of the present invention. The systems of FIGS. 2A-2D typically comprise a host (outside application) 100 and associated interface and interface controller, interacting with a flash memory device 105. The flash memory device 105 includes a micro-controller 110 and an array of cells including at least one erase sector 120, each erase sector including at least one physical page 130, each page including a plurality of cells 140. For example, if the page size is 2-4 KB and 2 to 4 bits are used per cell the number of cells is 4000 to 16000.

The flash memory device also includes circuitry for erasing data from cells 140, erase sector by erase sector rather than cell by cell, writing data into cells typically page by page, and reading data from cells, page by page (e.g. in NAND type flash memory) or cell by cell (e.g. in NOR type flash memory). The circuitry performing these functions is referenced herein as erasing circuitry 150, writing circuitry 160 and reading circuitry 170 respectively. An array of cycle counters 155 count, for each erase sector respectively, all erase-write cycles performed on that sector.

According to certain embodiments of the present invention, each erase sector includes at least one and optionally exactly one set of representative cells 172 whose cells are typically programmed during the manufacturing stage, and at least one high-reliability "statistic cell" 174 storing, e.g. previous mean information and/or previous standard deviation information regarding the representative cells 172 as described in detail herein. A direct physical value deterioration estimation unit 190 and a systematic read-threshold determination unit 180, which together are termed herein a read threshold estimator or "estimator" 192, interact with the representative cells 172 and high-reliability statistic cell/s 174 to generate read-thresholds and/or to estimate the extent of data deterioration, as described in detail herein with reference to FIGS. 3A-5.

It is appreciated that certain embodiments of the systems and methods shown and described herein typically include at least one of the following features:

a. Estimation of the deterioration of the physical values residing in the n-level cells is direct because current physical values, or a central tendency e.g. mean thereof, are compared to previous, high-reliability stored physical values or a central tendency e.g. mean thereof. In contrast, prior art systems may not directly estimate deterioration; instead they may indirect estimate deterioration e.g. by computing and comparing frequency of occurrence of current logical values thresholded from current physical values to a previously computed and high-reliability stored histogram of previous logical values thresholded from previous physical values or other stored indication of frequency of occurrence of certain categories of previous logical values.

High reliability cells are typically designed to store data so that the data can be retrieved without error even after cycling and retention. For example, high reliability cells may comprise single-level cells and/or may store BCH-encoded data with a large proportion of redundant bits such as 50% redundant bits. Or, to give a particularly simple example, high reliability cells may store each bit of information repeated many times such as 8 times.

b. Systematic determination of read thresholds (e.g. by computation or by use of look up tables) as a function of estimated deterioration of the physical values residing in the n-level cells. In contrast, prior art systems may employ a trial and error-based method for determination of read thresholds to fit estimated deterioration of the physical values residing in the n-level cells. For example, in the prior art, a first histogram of logical values may be generated initially by thresholding logical values from the initial physical values (programmed values) using original, typically manufacturer determined thresholds. This histogram is high-reliability stored. A second histogram of current logical values may be thresholded from current physical values (present values) using the same original threshold values and may be compared to the first histogram, so as to generate a first putative set of read thresholds which, if used on the current physical values, is hoped to result in a third histogram which is the same as the stored histogram. If the putative set of read thresholds does not succeed in doing this, the disappointing third histogram is compared to the first and second histograms so as to generate a second putative set of read thresholds. This process is repeated, typically on a trial and error basis, until eventually, a putative set of read thresholds is found which, if used on the current physical values, results in a current histogram which is the same as the stored histogram.

c. Only a small amount of previous information needs be high-reliability stored, as opposed to larger amounts of previous information which may require high-reliability storage in prior art systems. The representative cells, whose deterioration is representative of other cells in the erase sector or in the page, are stored at an ordinary level of reliability, like any other data cell. Typically, the only information pertaining to previous states of the flash memory cells is central tendency and/or variance information of these states. This central tendency (previous mean) information may be stored at a relatively low resolution typically comprising only a few bits (e.g. 4-5 bits), since this is the level of noise characterizing the physical charge induction distributions shown in FIG. 1. These few bits may be stored once per physical page or even only once per erase sector.

In contrast, in prior art flash memory systems with n-level cells, n−1 histogram values may be stored for each page, representing the original (before cycling and retention) distribution of physical values over the page. Each such histogram value typically must be stored at a resolution of a few dozen bits, since there are typically at least 1000 cells per page. Therefore, certain embodiments of the present invention may require as little as 4-5 bits of high-reliability storage per erase sector, as opposed to certain prior art systems which may require several thousand bits of high-reliability storage for each of the dozens or even hundreds of physical pages in the erase sector.

Figure 2A:
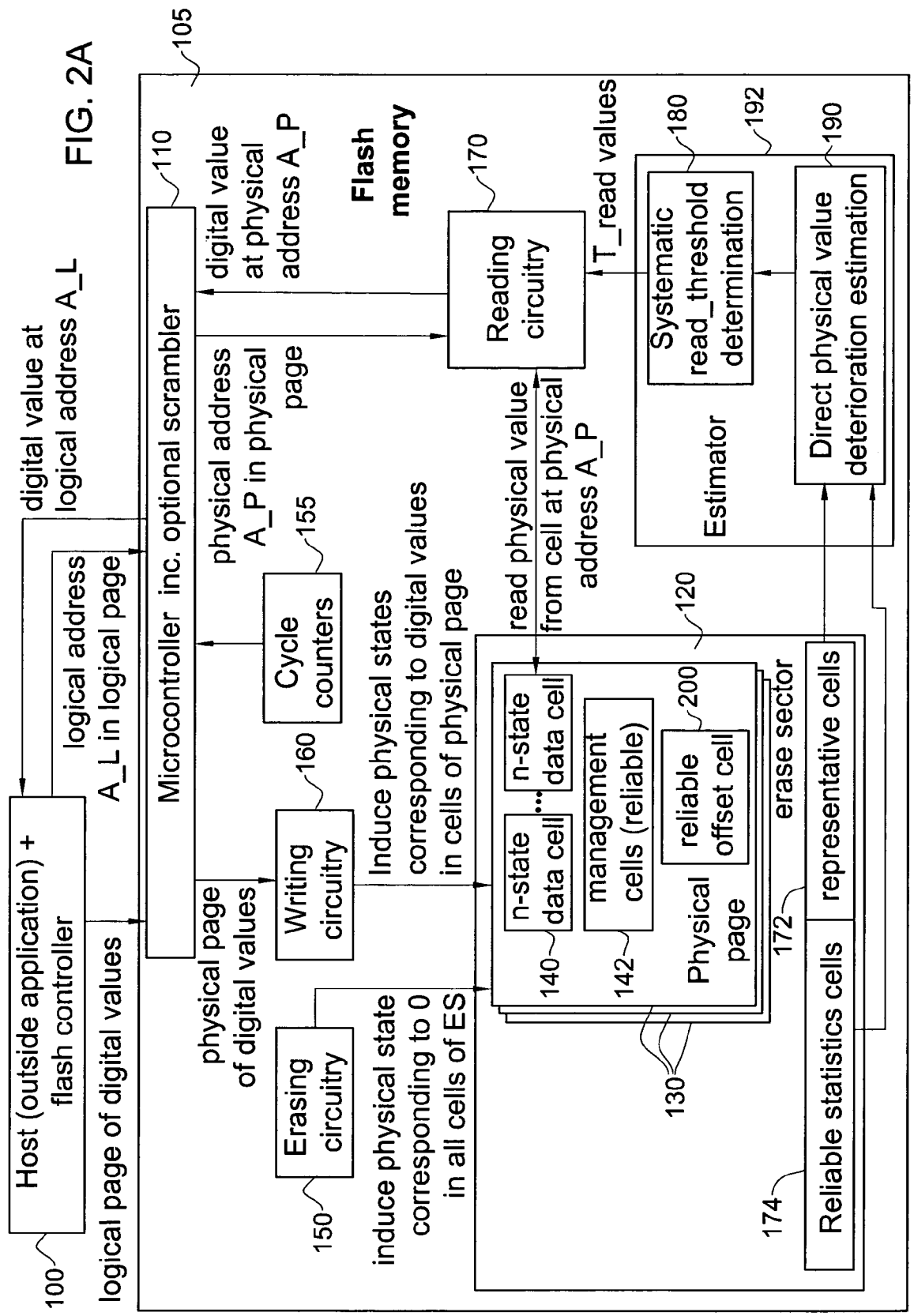
FIGS. 2A-2D are simplified functional block diagrams of an improved flash memory system with adjustable read thresholds, constructed and operative in accordance with certain embodiments of the present invention; specifically
Figure 2B:
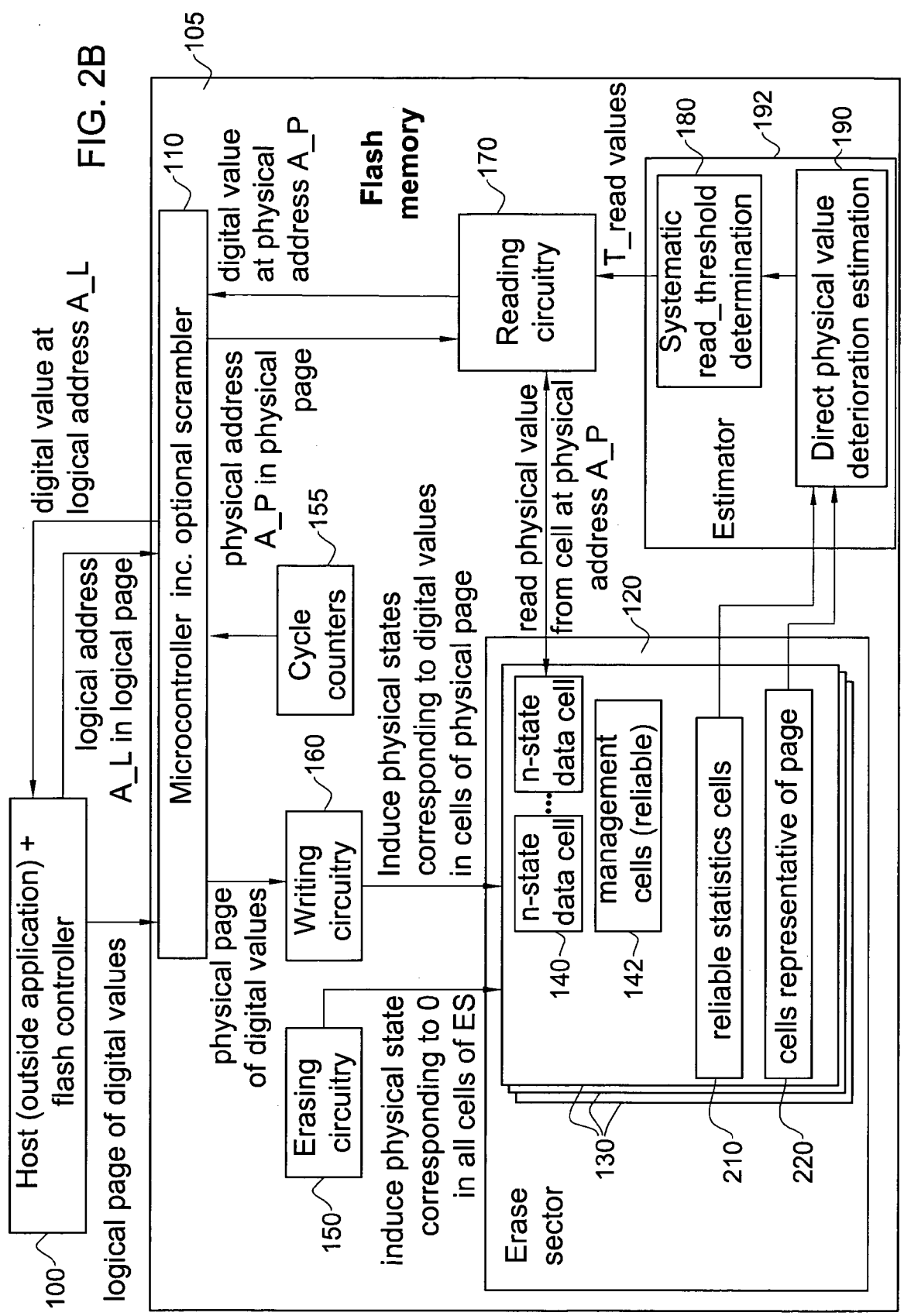
Figure 2C:
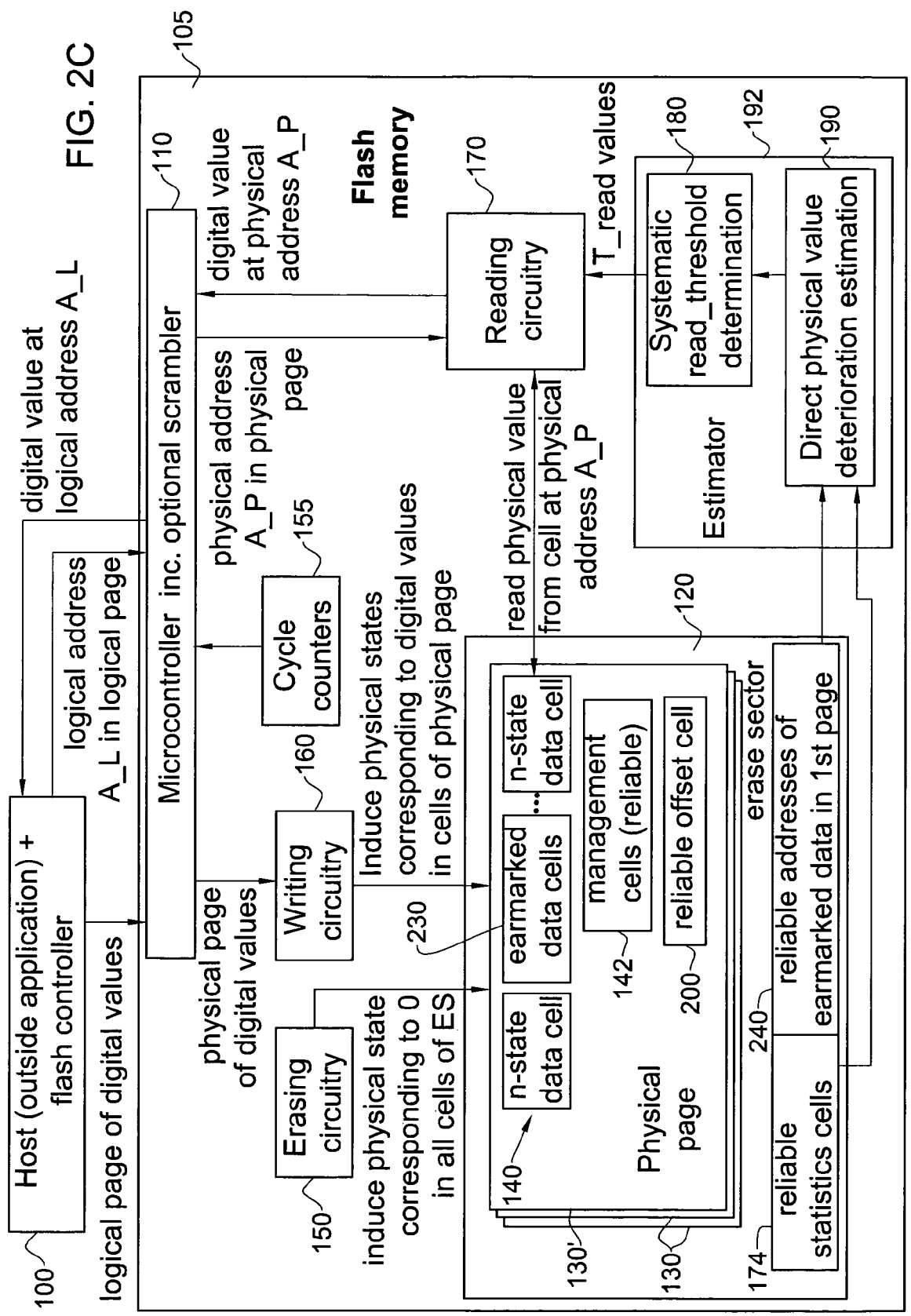
Figure 2D:
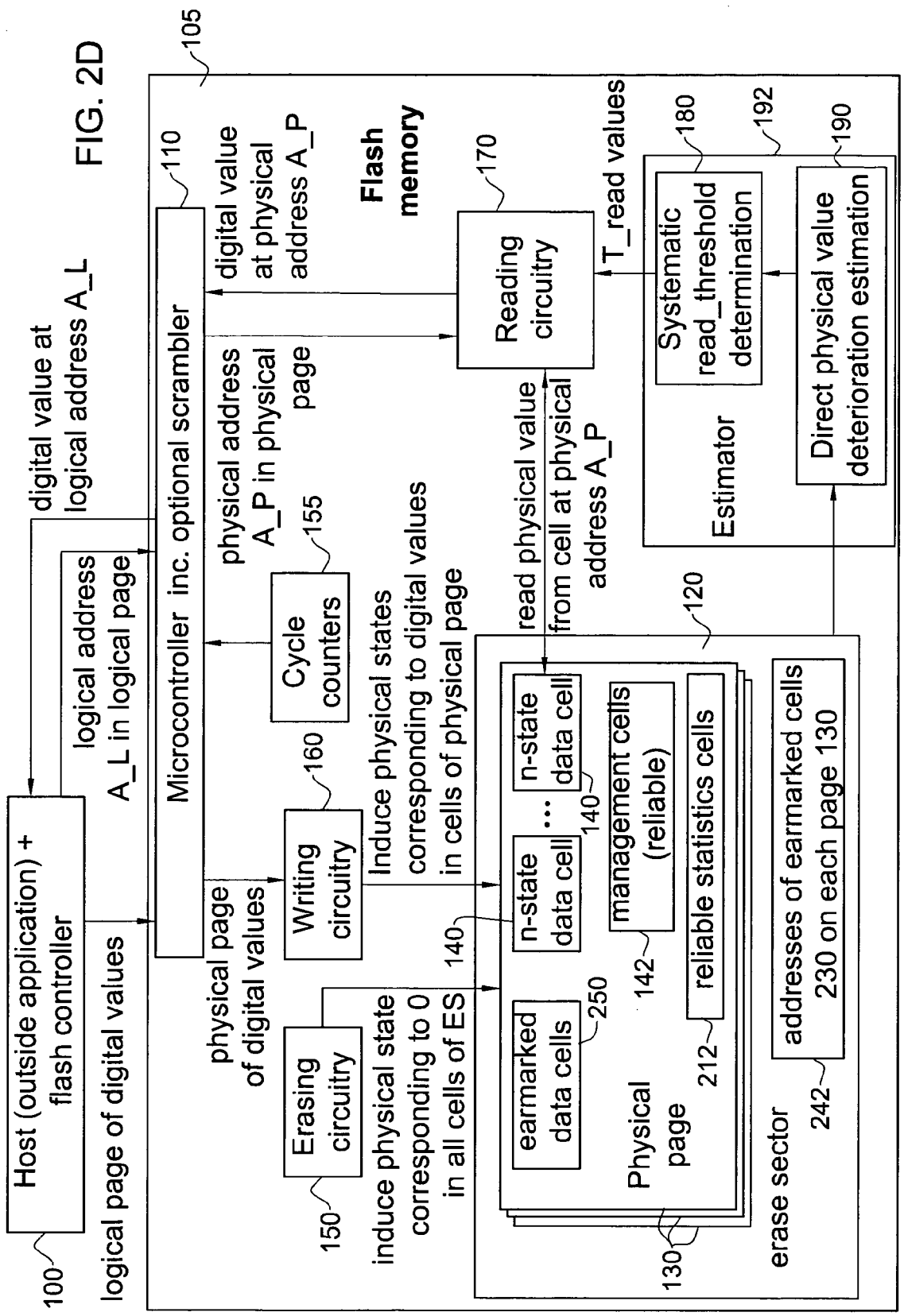

The embodiments of FIGS. 2A-2D are now compared. As described above, FIGS. 2A-2D are all simplified functional block diagrams of an improved flash memory system with adjustable read thresholds, constructed and operative in accordance with different embodiments of the present invention. Specifically, however, FIG. 2A illustrates a controlled, per-erase sector embodiment, FIG. 2B illustrates a controlled, per-page embodiment, FIG. 2C illustrates a blind, per-erase sector embodiment and FIG. 2D illustrates a blind, per-page embodiment.

In all of FIGS. 2A-2D, a set of representative cells is designated for monitoring deterioration, relative to highly reliable statistics cells which store at least statistics (e.g. mean and/or standard deviation or even raw values) of the set of representative cells as originally programmed i.e. before deterioration. The terms "controlled" and "blind" are used herein to differentiate embodiments in which the set of representative cells is set aside ("controlled" embodiments) from "blind" embodiments in which the set of representative cells is not set aside; instead, the representative cells are pre-designated ones from among the normal data cells and are used throughout to store normal, uncontrolled data. In the "controlled" embodiments of FIGS. 2A and 2B, the representative cells store controlled, special data such as several repetitions of each possible program level or only the highest program level. The terms "per erase sector" and "per page" are used to denote embodiments in which only one set of representative cells is designated for each erase sector, as opposed to embodiments in which each and every page in the erase sector has its own set of representative cells.

In the per-erase sector embodiments of FIGS. 2A-2C, a high reliability offset cell is typically provided on each page, whereas representative cells are stored only once per erase sector (as opposed to once per page in the per-page embodiments of FIGS. 2B and 2D). Before writing on a particular page in the erase sector, the representative cells are read, and their mean, variance and/or SNR at time of writing, are computed. At least one of these is stored in the particular page's offset cell or cells and is used, at the time of reading, as an indication of the time which elapsed between erasure of the erase sector to which the particular page belongs, and programming of the particular page. Typically, before reading the page, perhaps some years after it was programmed, the page's offset cells 200 and the erase sector's representative cells 172 are read. The mean and/or variance of the representative cells 172 at approximate time of reading is computed and the value of the corresponding offset cell is subtracted. The resulting delta-mean and/or delta-variance values are indicative of the time that has elapsed between the programming of the page and the reading thereof.

More generally, the time that has elapsed between programming and reading of a particular page is used as an indicator of deterioration. In per-page embodiments, this time can be directly estimated by comparing, e.g. subtracting, current (reading time) values of representative cells on a particular page, with highly reliably stored statistics of their values at time of programming. In per-erase sector embodiments, however, this time interval is estimated by subtracting an indicator of the time interval between writing and erasing, from an indicator of the time interval between reading and erasing. The representative cells' mean, variance or SNR serve as an indicator of the time interval between reading and erasing, whereas the corresponding statistic stored in the offset cell serves as an indicator of the time interval between writing and erasing.

It is appreciated that change in various statistics of the representative cells may be used to quantify the extent of deterioration, and, accordingly, to adjust reading thresholds, such as but not limited to any of the following:

$$V_{mean\_new} = \frac{1}{N}\sum_{i=1}^{N} V_{training\_cell\_i}$$

-continued $$\sigma_{Variance\_new} = \frac{1}{N} \sum_{i=1}^{N} (V_{training\_cell\_i} - V_{mean\_new})^2$$

$$\alpha = \frac{V_{mean\_new}}{V_{W\_mean}}$$

$$SNR_{new} = \frac{V_{mean\_new}^2}{\sigma_{Variance\_new}^2}$$

$$\text{diff\_SNR} = SNR_W - SNR_{new}$$

The above formulae represent, respectively, current mean; current variance; proportion between current mean and stored original mean; current SNR i.e. proportion between current mean and current variance; and difference between current SNR and original SNR, where "current" refers to values existing during reading and "original" refers to values existing during erasing or during writing.

Generally, SNR is defined as follows, where V_training_cell_i refers to the physical value stored in an individual one of the representative cells, N is the number of representative cells, and W is the window defined in FIG. 1.

$$V_{W\_mean} = \frac{1}{N} \sum_{i=1}^{N} V_{training\_cell\_i}$$

$$\sigma_{W\_Variance} = \frac{1}{N} \sum_{i=1}^{N} (V_{training\_cell\_i} - V_{W\_mean})^2$$

$$SNR_W = \frac{V_{W\_mean}^2}{\sigma_{W\_Variance}^2}$$

Figure 3A:
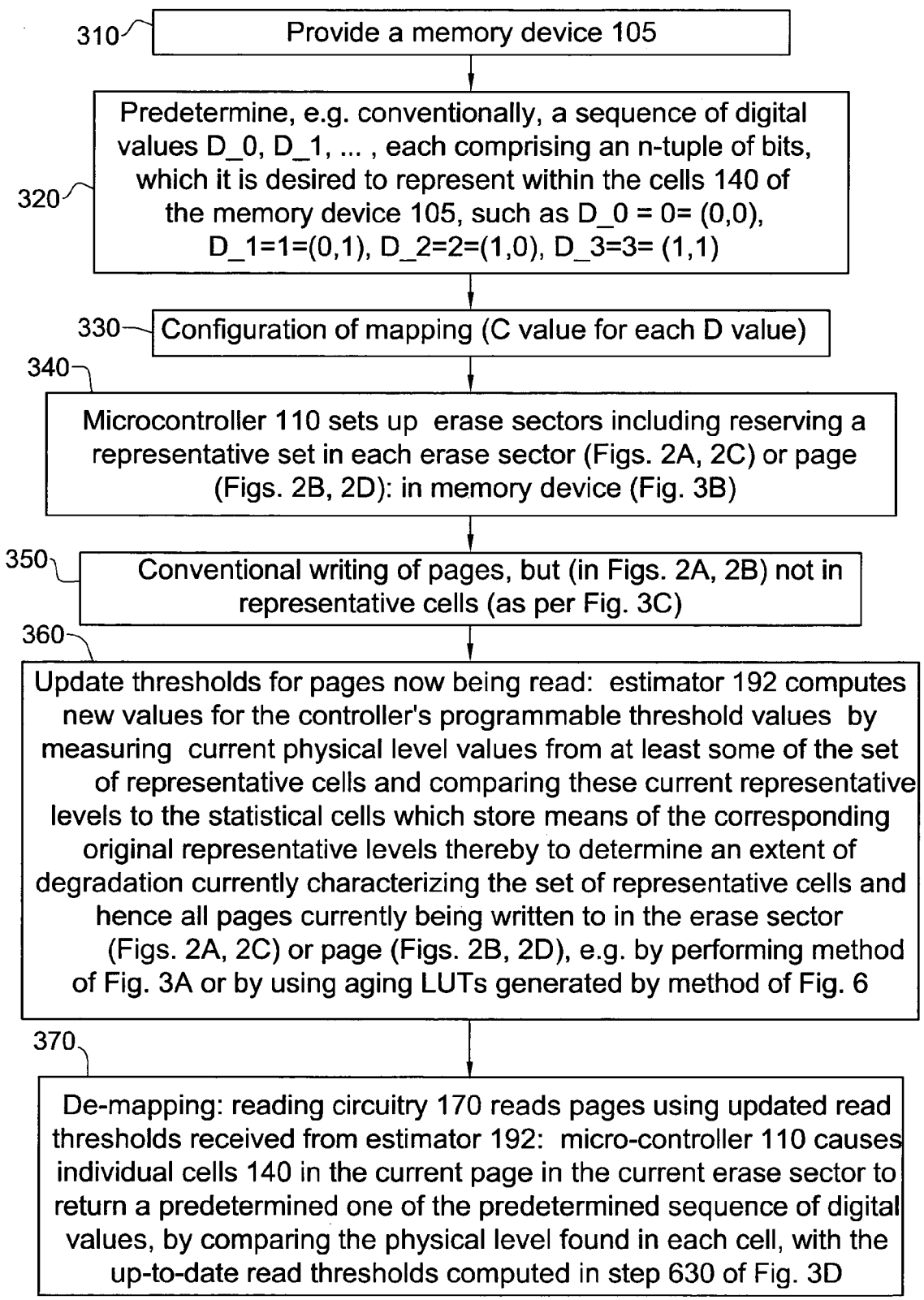
FIG. 3A is a simplified flowchart illustration of a method of operation for the systems of any of FIGS. 2A-2D, in accordance with certain embodiments of the present invention.

FIG. 3A is a simplified flowchart illustration of a method of operation for any of the systems of FIGS. 2A-2D, in accordance with certain embodiments of the present invention. The method of FIG. 3A typically comprises some or all of the following steps, suitably ordered e.g. as shown:

In step 310, conventionally provide a memory device 105 having erasing circuitry 150, writing circuitry 160, and reading circuitry 170; a micro-controller 110 controlling these; and erase sectors 120 (typically from a few to a few dozen), each erase sector including physical pages 130 (typically a few hundred), each physical page including cells 140, each erase sector being erased as a unit by the erasing circuitry, each page being written into e.g. as a unit by the writing circuitry 160.

In step 320, a sequence of logical values D_0, D_1, ..., each comprising an n-tuple of bits, which it is desired to represent within the cells 140 of the memory device 105, is predetermined, such as D_0=0=(0,0), D_1=1=(0,1), D_2=2=(1,0), D_3=3=(1,1)

In step 330, configuration of mapping is performed: typically at the manufacturing stage, configure at least one of the micro-controller 110, reading circuitry 170 and writing circuitry 160 to cause individual cells 140 in the memory device 105 to return a predetermined one of the predetermined sequence of logical values D_0, D_1, ..., if the memory cell 140 is found to be loaded with a corresponding one of a corresponding sequence of central physical values C_0, C_1, ... e.g. charge levels. Each charge level (except the lowest and highest) falls within a pair of programmable threshold physical values disposed on either side of the central physical value. In the above example, the sequence of charge levels corresponding to the sequence D_0, D_1, D_2, D_3 of logical values is C_0, C_1, C_2, and C_3. There may be 3 original threshold values T_0, T_1, T_2, and T_3 where central value C_0 is located below T_0, C_1 is located between T_0 and T_1, C_2 is located between T_1 and T_2, and C_3 is located above T_2. If the micro-controller finds a charge between T_i and T_(i+1) in an individual cell, the micro-controller associates the cell with the logical value i (i=0, 1, 2, 3).

For example, C_0, C_1, C_2, and C_3 may be −1 V, 1 V, 3 V and 5 V respectively, and T_1, T_2, and T_3 may be 0 V, 2 V and 4 V respectively i.e. each threshold value may be halfway between the C values on either side of it.

In step 340, microcontroller 110 sets up erase sectors including reserving a representative set in each erase sector (FIGS. 2A, 2C) or page (FIGS. 2B, 2D): e.g. for each erase sector (FIGS. 2A, 2C) or page (FIGS. 2B, 2D) in memory device, perform method of FIG. 3B.

In step 350 perform conventional writing of pages, but (in FIGS. 2A, 2B) not in representative cells: writing circuitry 160 writes data from an outside application 100 e.g. a Windows-generated document, e.g. page by page, in cells 140, within a given erase sector 120, however (in FIGS. 2A, 2B) not in the set of representative cells. Specifically, for each page j, perform the method of FIG. 3C.

In step 360, thresholds for pages now being read are updated: estimator 192 computes new values for the controller's programmable threshold values by measuring current physical level values from at least some of the set of representative cells and comparing these current representative levels to the statistical cells which store means of the corresponding original representative levels thereby to determine an extent of degradation currently characterizing the set of representative cells and hence all pages currently being written to in the erase sector (FIGS. 2A, 2C) or page (FIGS. 2B, 2D), e.g. by performing method of FIG. 3D.

In step 370, de-mapping is performed: reading circuitry 170 reads pages using updated read thresholds received from estimator 192: micro-controller 110 causes individual cells 140 in the current page in the current erase sector to return a predetermined one of the predetermined sequence of logical values, by comparing the charge level found in each cell, with the up-to-date read thresholds computed in step 630 of FIG. 3D.

FIG. 3B is a simplified flowchart illustration of a method for performing step 340 of FIG. 3A, in accordance with certain embodiments of the present invention. The method of FIG. 3B typically comprises some or all of the following steps, suitably ordered e.g. as shown:

In step 410, micro-controller 110 instructs erasing circuitry 150 to erase a sector.

In step 420, at about the same time, micro-controller 110 designates at least one set (e.g. 172) of representative cells e.g. 20 representative cells, per erase sector, e.g. 1 representative set per erase sector (per-erase sector embodiments of FIGS. 2A and 2C) or 1 representative set for each page in the erase sector (per-page embodiments of FIGS. 2B and 2D). Designation may comprise reserving the set/s of representative cells in the sense that no data is written in them (in controlled embodiments of FIGS. 2A, 2B) or earmarking certain data cells (in "blind" embodiments of FIGS. 2C, 2D) in the sense of making note of their addresses, typically by reliably storing these e.g. at memory locations 240 or 242.

In step 430 performed in controlled embodiments e.g. as per FIGS. 2A and 2B, micro-controller 110 loads the reserved representative cells 172 or 220 by instructing writing circuitry 160 to write, in each of the set of representative cells, predetermined physical levels such as all (typically manufacturer-determined) central values e.g. C0, ... C3 or such as only the maximum central value such as C3 in the example of FIG. 1 which may be 5V or any other manufacturer-determined value, or such as stepwise values as described below with reference to FIG. 4. Each value written into a set of representative cells may be written more than once so as to allow more than one independent evaluation of the degradation undergone by the value in question.

In step 435, micro-controller 110 stores, in a high-reliability location e.g. statistics cells 174, 210 or 212, at least one statistic of the charge levels stored in each set of representative cells e.g. central tendency (mean (M_erase), median, or mode) and/or standard deviation And/or even at least some of the charge levels themselves.

Figure 3C:
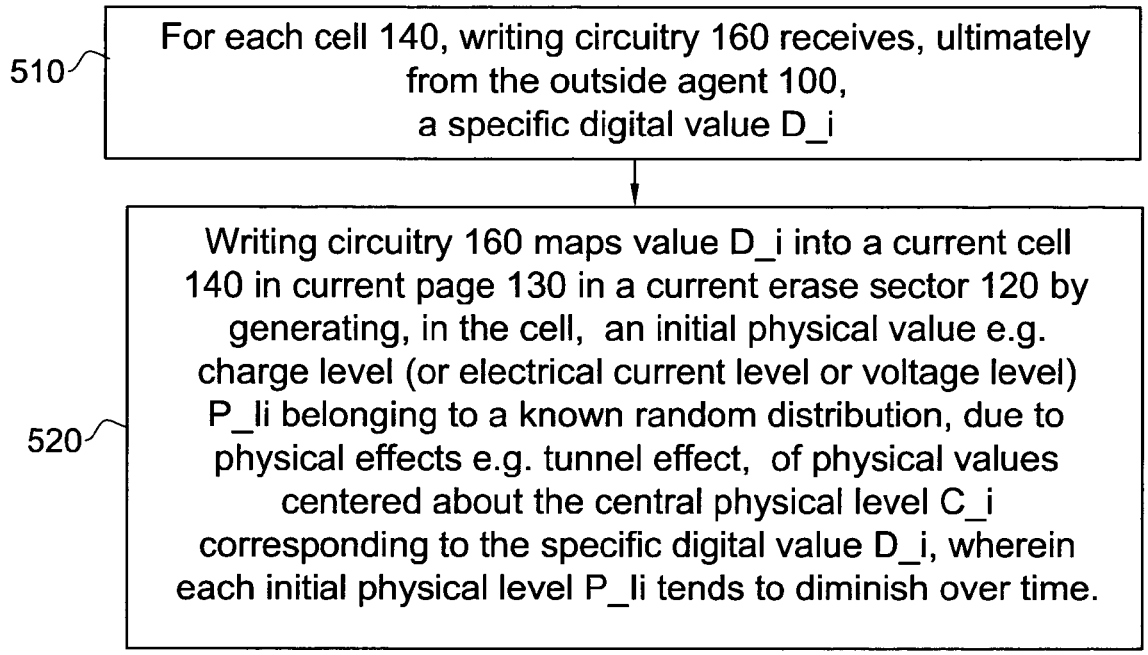
FIG. 3C is a simplified flowchart illustration of a method for performing step 350 of FIG. 3A, in accordance with certain embodiments of the present invention.

FIG. 3C is a simplified flowchart illustration of a method for performing step 350 of FIG. 3A, in accordance with certain embodiments of the present invention. The method of FIG. 3C typically comprises some or all of the following steps, suitably ordered e.g. as shown:

In step 510, for each cell 140, writing circuitry 160 receives, ultimately from the outside agent 100, a specific logical value D_i.

In step 520, writing circuitry 160 maps value D_i into a current cell 140 in current page 130 in a current erase sector 120 by generating, in the cell, an initial physical value e.g. charge level (or electrical current level or voltage level) P_Ii belonging to a known random distribution, due to physical effects e.g. tunnel effect, of physical values centered about the central physical level C_i corresponding to the specific logical value D_i, wherein each initial physical level P_Ii tends to diminish over time. Charge or current or voltage levels in a cell may be generated in any suitable application-specific manner e.g. by changing resistance, changing capacitor voltage, or changing current, in the cell.

FIG. 3D is a simplified flowchart illustration of a method for performing step 360 of FIG. 3A, in accordance with certain embodiments of the present invention. The method of FIG. 3D typically comprises some or all of the following steps, suitably ordered e.g. as shown:

In step 610, direct physical value deterioration estimation unit 190 computes at least one current central characteristic, e.g. mean (or median or mode) of current charge levels in the erase sector's representative set, M_read (FIGS. 2A, 2C) or M_read_j (FIGS. 2B, 2D); this can be stored in temporary memory of the micro-controller 110. M_read is page-specific (has subscript j) in per-page embodiments (FIGS. 2B, 2D) in which each page has a representative set, and is global (has no subscript j) over all pages in erase sector, in per-erase sector embodiments (FIGS. 2A, 2C) in which the erase sector has but a single representative set.

In step 620, direct physical value deterioration estimation unit 190 computes a proportion (threshold attenuation factor) alpha=M_read/M_write for the entire erase sector (per-erase sector embodiments of FIGS. 2A, 2C)) or M_read j/M_write_j for each page therewithin (per-page embodiments of FIGS. 2B, 2D).

Figure 7A:
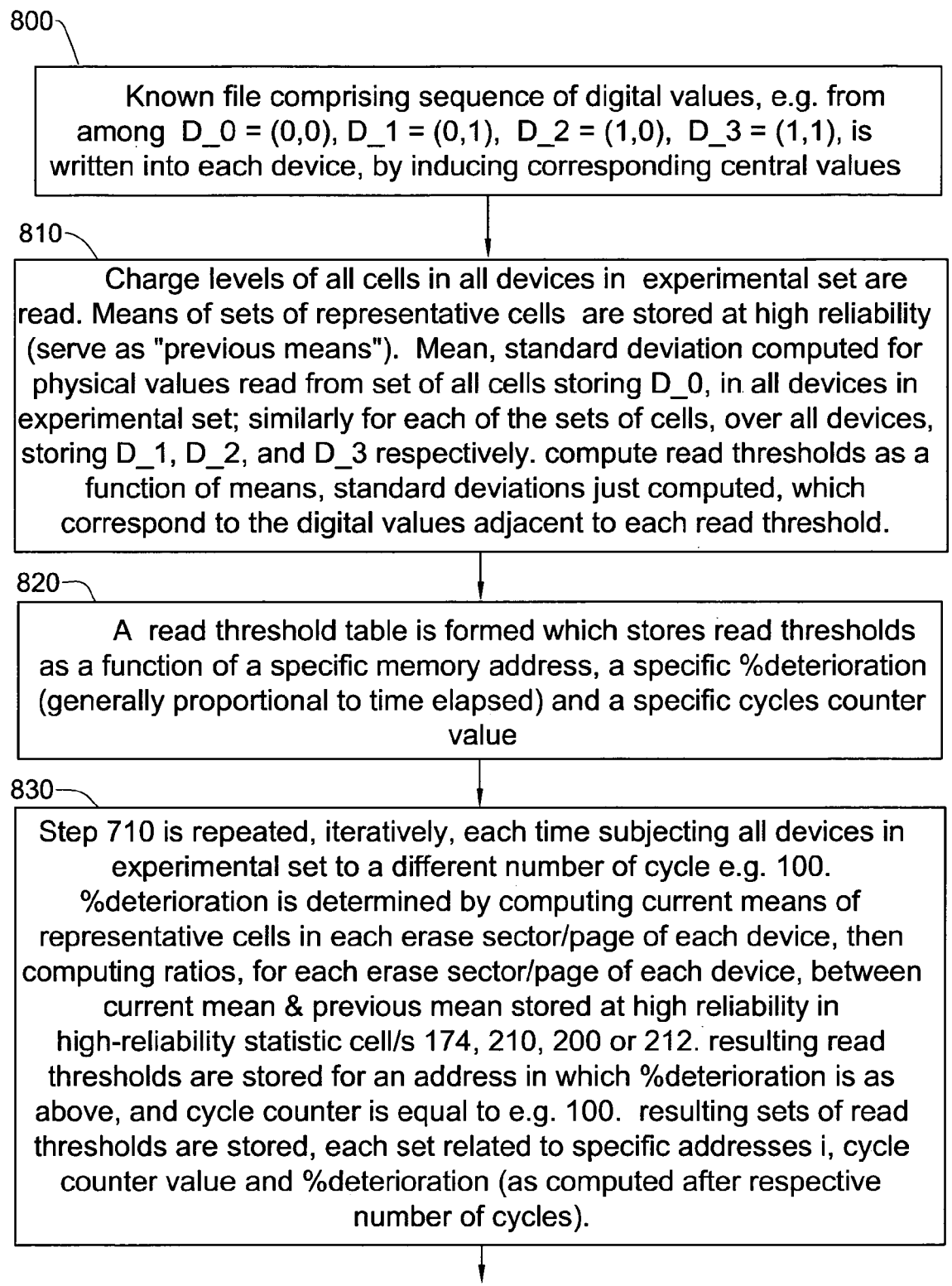
FIGS. 7A-7B, taken together, form a simplified flowchart illustration of a method for constructing a look-up table which can be used to update thresholds each time a flash memory device is read e.g. as described in the threshold updating step 360 of FIG. 3A.
Figure 7B:
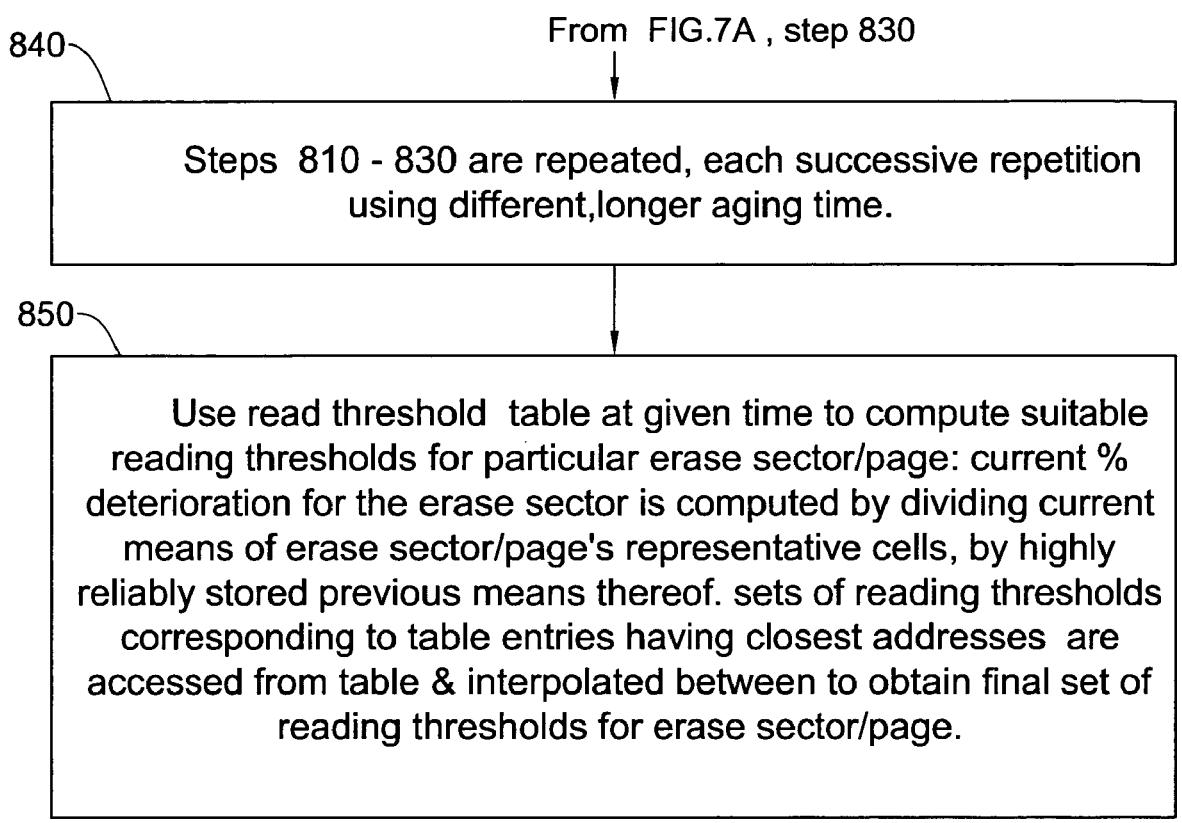

In step 630, for the entire erase sector (per-erase sector embodiments of FIGS. 2A, 3C) or for each page therewithin (per page embodiments of FIGS. 2B, 2D), systematic read-threshold determination unit 180 defines a current sequence of read thresholds T_READ_0, T_READ_1, T_READ_2, T_READ_3, T_READ_4 e.g. by multiplying the appropriate proportion computed in step 620 by the initial sequence of read thresholds T_0, T_1, T_2, T_3, T_4 respectively or by using a LUT as described herein with reference to FIGS. 7A-7B.

In the blind, per ES embodiment of FIG. 2C, the high-reliability management cells 142 store, inter alia, an indicator of a page e.g. pointer or stored page number, to be used as a reference for mean computations. It is appreciated that in the embodiment of FIG. 2C, only some of the pages in the erase sector, as indicated by reference numeral 130', have earmarked data cells 230 among the array 140 of data cells. No data cells are earmarked in the remaining pages which are indicated in FIG. 2C by reference numeral 130. In the illustrated embodiment, by way of example, it is assumed that only one of the pages in the erase sector 120—the first page—has earmarked data cells, however this is not intended to be limiting.

Referring again to FIG. 3A, generally, in blind embodiments, inter alia, of this invention, a representative set is designated, e.g. for each erase sector, or for each page in each erase sector. However, in blind embodiments as opposed to controlled embodiments, instead of reserving, including subsequently not storing data in, a representative set for each page, in step 340, a subset of the data cells in each page or erase sector is designated. This subset is typically larger than the representative set of the controlled embodiment (e.g. 100 cells instead of 20 cells per representative set). Typically, the designation of the subset may be preprogrammed into the micro-controller 110 and may comprise (for per-ES embodiments) an indication of a page within each erase sector, and cell addresses within that page, which constitute the representative cells, or (for per-page embodiments) an indication of the cell addresses within each page which constitute the representative cells. Typically, in per-ES embodiments, the same page is used in all erase sectors to store the representative cells. Also, typically, the same cell addresses within each relevant page, are assigned to the representative cells.

Any suitable number of representative cells may be provided. It may be desired to select a number of cells so as to achieve a level of reading errors which does not exceed a predetermined acceptable level. The predetermined level may for example comprise P_target, a predetermined maximum proportion of pages containing so many errors as to be uncorrectable by said error correction code. To achieve this, for applications in which gray coding is used as is conventional, the number of representative cells, N, may be selected on the basis of the following inequality:

$$\max_x \frac{(2L-2)}{L\log_2 L} \cdot Q\left(\frac{W - 2(L-1)|x|}{2(L-1)\sigma}\right) \cdot f_{shift}(|x|) < P_{Target}$$

N is selected as the x which maximizes the expression appearing on the left of the above inequality, from among all x's for which the above inequality holds. The parameters in the above inequality are described below:

L=number of program levels per cell $$Q(X) = \int_{x=X}^{\infty} \frac{1}{\sqrt{2\pi}} e^{-x^2/2}.$$

W=the window of logical values each cell may store after retention (during reading) e.g. the "window" in the bottom graph of FIG. 1 extending between D_0 and D_3.

σ=Standard variation of the random free coefficient n after retention (i.e. during reading), using the following model for the current physical value V_read from a cell, after retention, as a function of the physical value V_program originally programmed into the cell: V_read=alpha(retention, cycling)×V_program+n.

$$f_{Shift}(|x|) = 2\sqrt{\frac{N}{2\pi(\sigma^2 + \sigma_{measure2})}} \exp\left(-\frac{x^2}{(\sigma^2 + \sigma_{measure2})} \cdot \frac{N}{2}\right).$$

σ_measure=Standard variation of the soft measurements

Figure 4:
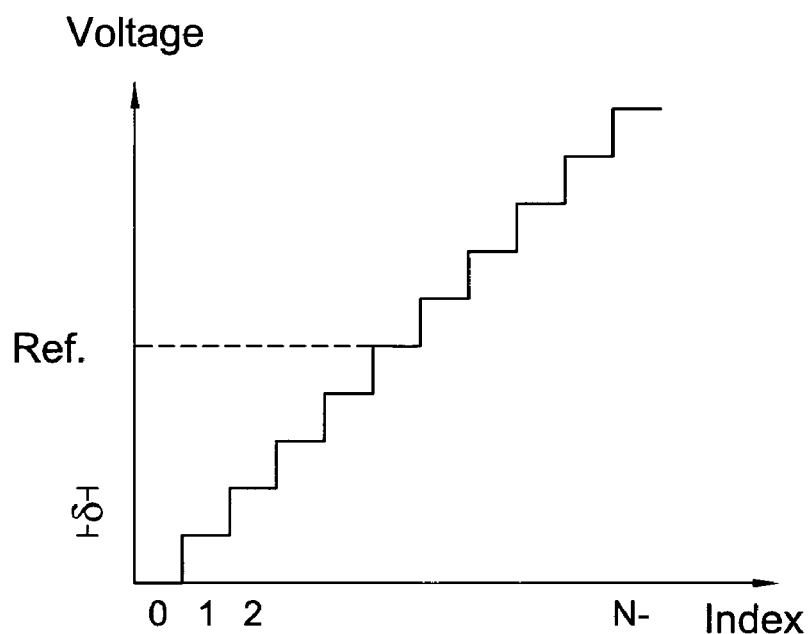
FIG. 4 is a voltage vs. cell index graph showing reference voltages for each of a plurality of representative cells provided in accordance with a "soft" embodiment of the present invention suitable for "hard read" applications.

FIG. 4 is a voltage vs. representative cell index graph showing one alternative for performing step 430 of FIG. 3B, termed herein the "ramp" or "soft" embodiment. Specifically, FIG. 4 illustrates a method for loading representative cells provided in accordance with any of the controlled embodiments of the present invention (e.g. the embodiments of FIGS. 2A and 2B), in accordance with a "soft" variation of the present invention suitable for "hard read" applications.

In these applications, "hard values", e.g. as defined below, are written into cells, and a precise read (also termed herein "soft read") is used to estimate the statistics of the representative cells. As described above, the terms "Precise read" and "soft read" refer to reading cell threshold voltages at a precision (number of bits) greater than the number of Mapping levels ($2^n$) of the cell. In contrast, in "hard read", cell threshold voltages are read at a precision (number of bits) smaller than the number of Mapping levels ($2^n$).

Figure 5:
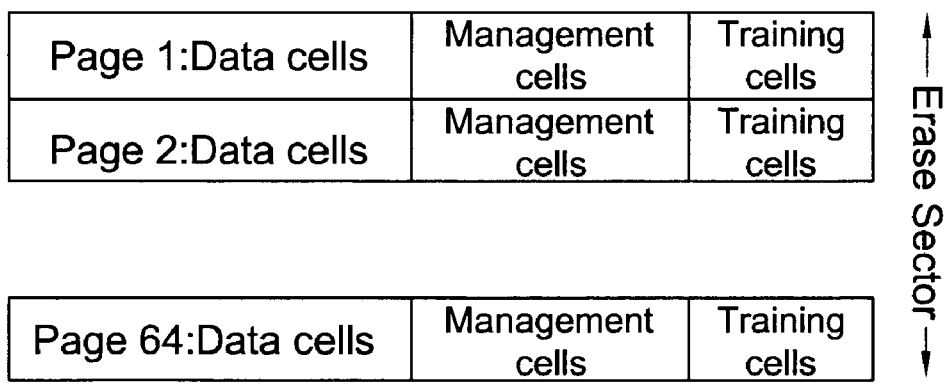
FIG. 5 is a prior art, simplified data structure illustration of a data structure for an erase sector.

If it is desired to estimate the degradation proportion (threshold attenuation factor) in resolution of less than δ volts, the method of FIGS. 3A-3D may be varied as follows:
1. In step 430 of FIG. 3B, write N=W/δ staircase values in the N representative cells 172 or 220 (W is the window shown in the top, before-retention graph of FIG. 1). Each staircase value is δ volts greater than the previous one as illustrated in FIG. 5.
2. In step 435, a reference level, indicated by "Ref" in FIG. 4, and the original decision levels (original, typically manufacturer-determined, thresholds) are stored e.g. as OTPs (one-time programmed values) in a high reliability section of the flash memory device e.g. in management cells 142 of FIGS. 2A-2B.
3. To compute the M_read value in step 610, count the numbers of value in the sequence that are less than the reference value and mark them as M_read.
4. In step 620, the proportion (threshold attenuation factor) is M/N.

In step 630, read the reliably stored original decision levels and adjust them by multiplying by the attenuation level M/N.

More generally and according to certain variations of the "soft" embodiment of FIG. 4, a binary read e.g. Sandisk memory device is provided wherein the reading circuitry comprises one or more binary readers r=1, 2, . . . , each binary reader r having a first "hard value" output e.g. 0 if the physical level in a cell being read is below a binary level L_r characterizing binary reader r specifically, and a second output e.g. 1 if the physical level in the cell being read is above the binary level L_r, such that the physical level in the cell can be appreciated by observing the outputs of the various binary readers. A sequence of logical values is predetermined e.g. conventionally, which it is desired to represent within the cells of the memory device, wherein the number of logical values in the sequence typically equals r, the number of binary readers. For each erase sector in the memory device, the sector is erased and at that time, a set of representative cells is reserved e.g. 50 representative cells. A predetermined preferably evenly varying sequence of physical levels extending from lowest to highest physical e.g. present levels e.g. 0.1V, 0.2V, . . . , 4.9V, 5.0V is written into the set of representative cells.

Updating thresholds for pages now being read may comprise reading the cells in the representative set. The microcontroller 110 of FIGS. 2A-2D indicates that a certain proportion of them are 1, namely fall above the initial threshold value T_1. The rest, typically more than half due to degradation of the physical levels, are 0 because they fall below the initial threshold value T_1. A proportion is then computed, also termed herein the "degradation proportion": the number of cells in the representative set which are 1, divided by the number of cells in the representative set which are 0.

In contrast to the various embodiments shown and described herein, FIG. 5 illustrates a prior art system with a set of representative cells for each page. The set of representative cells is designed to estimate the aging of the flash Memory which in turn is indicative of flash memory device quality. As described above, the flash memory device aging results from program and erase cycles and retention time. The flash memory device erase sectors and pages are not uniform in the amount of aging they experience. The aging process is apparent by comparing the top and bottom graphs in FIG. 1 and may result in diminished window size (W in FIG. 1) and increased noise variance at all levels. The consequence is loss in the signal to noise ratio and increase in the number of error bits.

Referring back to FIG. 1, for example, the top graph of FIG. 1 shows original decision regions, delimited by the original threshold levels; for instance, if the cell voltage is above decision level T1 but less then decision level T2, the reading circuitry decides that the stored bits are D1=(0,1). Optimal tuning of threshold levels, also termed herein "computation of threshold levels", reduces the number of error bits to a minimum. The ability to tune the threshold levels depends, in prior art systems, on pre-defined known data or voltage levels or on a set of representative cells.

Since each page has a different aging level a set of representative cells may be used to estimate its condition. A microcontroller may allocate a few cells in each page to store the pre-defined set of representative cells. This conventional, prior art approach is depicted in FIG. 5. The number of cells allocated for each page depends on the accuracy or the number of bits per cell which it is desired to store. The error in the estimation is proportional to the inverse of the square roots of number of cells.

Example: For 2 bits per cell and an un-coded bit error rate of 1E-3 a minimum window signal to noise ratio (SNR) of 28 (or 14.5 dB) is typically employed. Maintaining a slight degradation in the signal to noise ratio (SNR) requires approximately 100 cells for the set of representative cells. The SNR is computed as the ratio between the window variance and the noise variance.

$$SNR = \frac{E(w - \text{mean}(w))^2}{\sigma_n^2}$$

However since the erase sector cycles are common to all pages within the erase sector, the set of representative cells typically stores two types of data:
1. Base sequence common to all pages in a specific erase sector. It is stored in management cells that are allocated to an erase sector (or, e.g. in per-page embodiments, to each page).
2. Incremental value that stores the difference between the base sequence value of the erase block and the specific page value.

The "set of representative cells" described herein stores a "representative sequence" of data respectively which is known to the estimator 192. Hence, any deviation from the known values can be used to estimate aging of the flash memory device in the vicinity of these cells.

It is appreciated that the conventional process for providing flash memory devices includes an initial test chip product phase, followed by a configuration phase, also termed herein the "sort phase", in which the test chips are configured for various applications. Finally, flash memory chips are manufactured for each of the desired applications, in a so-called manufacturing phase.

As described above with reference to the reading threshold computation step 360 of FIG. 3A, according to one embodiment of the present invention, look up tables storing aging information are used to compute reading thresholds.

It is appreciated that if in a particular application, deterioration of programmed values can safely be assumed to be linear with respect to the programmed values themselves, then as described above with reference to FIG. 3D, read thresholds T_READ can be set to a proportion of the original threshold values T. In this case, the proportion is simply the ratio of the current mean of the representative cells (the mean of the representative cells' present values), over the reliably stored previous mean of the representative cells (the mean of the representative cells' programmed values).

However, in some applications, the representative cells do not include a subset dedicated to storing each of the central values $C\_i$, and/or it is not desirable to assume that the deterioration of programmed values is linear with respect to the programmed values themselves. In such applications, the embodiment of FIG. 3D may not be suitable for effecting the reading threshold computation step 360 of FIG. 3A. In this case, according to one embodiment of the present invention, look up tables storing aging information are used to compute the reading thresholds.

According to this embodiment, aging look up tables are typically generated during the "sort phase" of production. Typically, a number of devices is used which is sufficient to ascertain, by experiment, the nature of the aging process. All the devices are programmed with pre-defined data for a known number of program/erase cycles and are baked in an oven to simulate an accelerated retention process. According to some embodiments, the following model for the aging process is employed:

$$V_{read} = \alpha V_{program} + n$$

$$\alpha = \alpha(\text{cycling}, \text{retention})$$

$$\sigma_n = \sigma_n(\text{cycling}, \text{retention})$$

This model indicates that the physical value read from the cell is a linear function of the physical value originally programmed into the cell; the coefficient of the original value being a function both of cycling and retention; and the random free coefficient being characterized by variance whose magnitude is also a function both of cycling and retention as described e.g. in Neal Mielke et al, "Flash EEPROM Threshold Instabilities due to Charge Trapping During Program/Erase Cycling", IEEE Transactions On Device And Materials Reliability, Vol. 4, No. 3, September 2004, p. 335.

The aging look up tables (LUTs) may for example comprise an effective memory age table, storing effective memory age (believed to be related to time between writing and reading) as a function of, e.g. cycle counters and current mean values of the set of representative cells, or as a function of cycling and another measure of retention, and a reading threshold table, storing reading thresholds for the various levels stored in each flash memory cell, given aging values and cycle counter values. However, this is not intended to be limiting. Information relating reading thresholds to aging information may be stored in any suitable format, such as a first table storing effective memory age as a function of cycling and retention and a second table storing reading thresholds, also as a function of cycling and retention.

Figure 6:
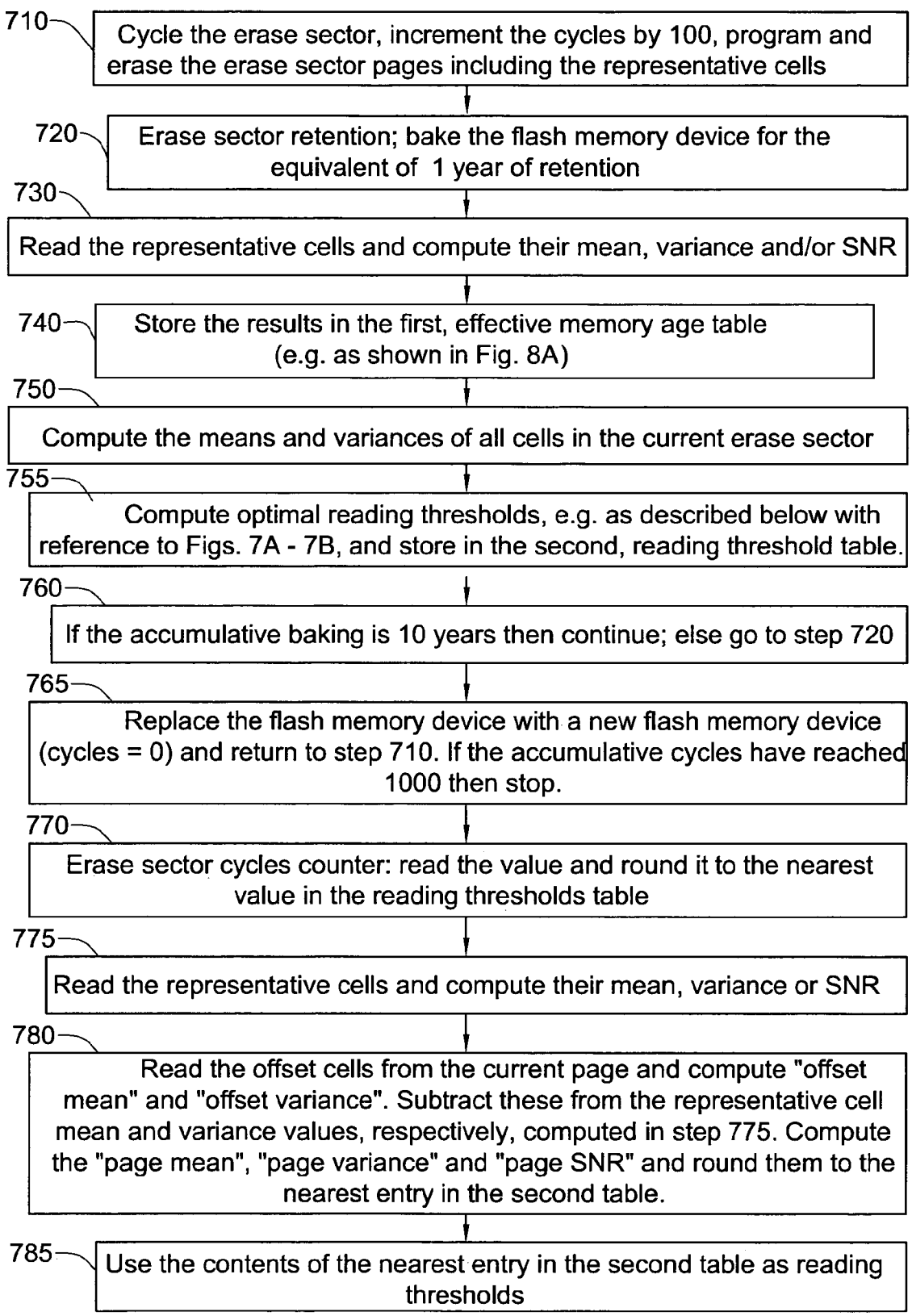
FIG. 6 is a simplified flowchart illustration of a method for constructing look-up tables useful in generating read thresholds adapted to the effective age of a flash memory device as affected by the retention and cycling undergone by the device, according to certain embodiments of the present invention.

FIG. 6 is a simplified flowchart illustration of a method for generating aging look-up tables, including a first table storing effective memory age as a function of cycling and retention and a second table storing reading thresholds also as a function of cycling and retention. The method of FIG. 6 includes some or all of the following steps, suitably ordered e.g. as shown:

Step 710: Cycle the erase sector, increment the cycles by 100, program and erase the erase sector pages including the representative cells.

Step 720: Erase sector retention; bake the flash memory device for the equivalent of 1 year of retention.

Step 730: Read the representative cells and compute their mean, variance and/or SNR.

Step 740: Store the results in the first, effective memory age table (e.g. as shown in FIG. 8A).

Step 750: Compute the means and variances of all cells in the current erase sector.

Step 755: Compute optimal reading thresholds, e.g. as described below with reference to FIGS. 7A-7B, and store in the second, reading threshold table.

Step 760: If the accumulative baking is 10 years then continue; otherwise go to step 720.

Step 765: Replace the flash memory device with a new flash memory device (cycles=0) and return to step 710. If the accumulative cycles have reached 1000 then stop.

Step 770: Erase sector cycles counter: read the value and round it to the nearest value in the reading thresholds table.

Step 775: Read the representative cells and compute their mean, variance or SNR.

Step 780: Read the offset cells from the current page and compute "offset mean" and "offset variance". Subtract these from the representative cell mean and variance values, respectively, computed in step 775. Compute the "page mean", "page variance" and "page SNR" and round them to the nearest entry in the second table.

Step 785: Use the contents of the nearest entry in the second table as reading thresholds.

A suitable method for generating the second, reading threshold look up table is now described in detail with reference to FIGS. 7A-7B. Typically, the method of FIGS. 7A-7B is based on an experimental process whereby look up tables are built which determine an appropriate reading threshold given that:

(a) the flash device has undergone a known number of cycles as indicated by cycle counter 155 of FIG. 2A (at a given resolution of, say, 100 cycles) and (b) a known amount of time has elapsed from programming to reading (from programming to the present). This amount of time may be known by relying on the information in the offset cells 200, in per-ES embodiments, or by comparing current (during reading) means to offset means e.g. as described above with reference to FIG. 6.

It is appreciated that cycle counters are also termed, in the literature, the "wear level" and are typically maintained in the course of performing the device's wear leveling algorithm.

The experimental process typically is performed on an experimental set of flash memory devices of a particular species or a particular batch, typically comprising a number of devices, such as 100 devices or 1000 devices, large enough to make the experimental set representative of the entire batch or species. The process may comprise the following steps as shown in FIGS. 7A-7B:

Step 800: A known file, comprising a sequence of logical values, say logical values from among the following set: $D\_0=(0,0), D\_1=(0,1), D\_2=(1,0), D\_3=(1,1)$, is written into each of these devices, by inducing the corresponding central values $C\_0, C\_1, C\_2, C\_3$.

Step 810: The charge levels of all cells in all devices in the experimental set are then read. Means of the sets of representative cells designated in accordance with an embodiment of the present invention, are stored at high reliability, to serve as "previous means" as shown and described herein. A mean and standard deviation are computed for the physical values read from the set of all cells storing $D\_0$, in all devices in the experimental set. Similarly, a mean and a standard deviation are computed for each of the sets of cells, over all devices, storing $D\_1, D\_2$, and $D\_3$ respectively. The above read-threshold computation formula is used to compute read thresholds $T\_READ\_0$, to. $T\_READ\_3$, as a function of the means and standard deviations just computed, which correspond to the logical values adjacent to each read threshold.

Step 820: A table is formed which stores the read thresholds as a function of a specific memory address, a specific percentage of deterioration (which generally is proportional to time elapsed) and a specific value of the cycle counter 155 of FIGS. 2A-2D (i.e. a given number of erase-program cycles that the erase sector in question has undergone). For example, the above-computed read thresholds are stored for an address in which the percent of deterioration is equal to 0 and the cycle counter is equal to 0.

Step 830: Step 810 is repeated, iteratively, each time subjecting all of the devices in the experimental set to a different number of cycles, 100 for example, the percent of deterioration is determined by computing current means of the representative cells in each erase sector/page of each device, and then computing ratios, for each erase sector/page of each device, between the current mean and the previous mean stored at high reliability in high-reliability statistic cell/s 174, 210, 200 or 212 (depending on the specific embodiment). The resulting read thresholds are stored for an address in which the percent of deterioration is as above, and cycle counter is equal to 100.

The resulting sets of read thresholds are stored, each set related to specific addresses i, cycling number and percent of deterioration (as computed after the respective number of cycles).

Step 840: Steps 810-830 are iteratively repeated, each successive iteration using a different and longer aging time. The time can be simulated on the devices. For example, the devices may be heated to a particular temperature, for a particular amount of time. Both temperature and time interval are conventionally used to simulate half a year of aging. This provides an additional set of entries in the table, in which the percent of deterioration of each entry is larger than the percent of deterioration of the corresponding entry computed in the course of the previous iteration.

Step 850: To use the above table at a given time to compute suitable reading thresholds for a particular erase sector or page, a current percent of deterioration for the erase sector is first computed by dividing current means of the erase sector's or page's representative cells, by the highly reliably stored previous means thereof. The number of cycles undergone by the erase sector or page therewithin is known from cycle counters 155 (FIGS. 2A-2D) which are conventionally stored in the flash device. The sets of reading thresholds $T\_READ\_0$, to $T\_READ\_3$, corresponding to the table entries having the closest addresses (i.e. having percent of deterioration closest to the erase sector's or page's percent of deterioration, and having a number of cycles closest to the number of cycles endured by the erase sector or page) are accessed from the tables, and typically interpolated between to obtain a final set of reading thresholds for the individual erase sector or page.

FIG. 8A is an example of a first table storing effective memory age as a function of cycling and retention. FIG. 8B is an example of a second table storing reading thresholds as a function of cycling and retention.

An example of how offset cells 200 in FIG. 2A or 2C may be used to compute page-age i.e. time elapsed between page-read and page-write, in per-ES embodiments of the present invention, is now described:

Before an individual page in a particular erase sector is programmed, representative cells, either reserved as in FIG. 2A or earmarked as in FIG. 2C, are read from the erase sector, and the representative cells' mean or variance is computed. If the erase sector has 100 cycles and the variance is 100 mV^2, the retention time, 1 year, is read from the table of FIG. 8A (because 100 mV^2 appears in the "year=1" column of the first (cycle=100) row) and is stored in offset cell 200. The page is then programmed. Eventually, the same page is read. Before doing this, the erase sector's representative cells are read and their mean or variance computed. If the erase sector has 100 cycles and the variance is 110 mV^2, a retention time of 2 years is read from the table of FIG. 8A (because 110 mV^2 appears in the "year=2" column of the first (cycle=100) row). Subtracting the offset value, a 1 year entry into the table of FIG. 8B is obtained: 2 years−1 year=1 year. Using the table of FIG. 8B, the 100 cycle and 1 year entries yield reading thresholds of 0 V, 2 V and 4 V which are used to read the data from the individual page. Subsequent reading of the same page, perhaps a few months or years later, will compute and employ different reading thresholds.

According to still a further embodiment of the present invention, a set of representative cells may be allocated only once per memory device, rather than once per erase sector or even once per page, as shown.

It is appreciated that determination of reading thresholds is not the only application for use of knowledge pertaining to extent of deterioration in flash memory or other memory which tends to deteriorate. The scope of the present invention is intended to include any method for using an array of memory cells storing physical levels which diminish over time and which comprises determining extent of deterioration of the physical levels and using the array of memory cells so as to take into account the extent of deterioration. For example, it may be desired to "scrub", or perform other manipulations on portions or all of a flash memory device when a predetermined level of deterioration is detected therein. Detection of the deterioration for this purpose might employ any of the methods shown and described herein. Methods for scrubbing are known and are described e.g. in U.S. Pat. No. 5,657,332 to Auclair et al, assigned to Sandisk and entitled "Soft errors handling in EEPROM devices".

Any data described as being stored at a specific location in memory may alternatively be stored elsewhere, in conjunction with an indication of the location in memory with which the data is associated. For example, instead of storing offset cells or training cells within a specific page or erase sector, the same may be stored within the flash memory device's internal microcontroller or within a microcontroller interfacing between the flash memory device and the host, and an indication may be stored of the specific page or erase sector associated with the cells.

Certain operations are described herein as occurring in the microcontroller internal to a flash memory device. Such description is intended to include operations which may be performed by hardware which may be associated with the microcontroller such as peripheral hardware on a chip on which the microcontroller may reside. It is also appreciated that some or all of these operations, in any embodiment, may alternatively be performed by the external, host-flash memory device interface controller including operations which may be performed by hardware which may be associated with the interface controller such as peripheral hardware on a chip on which the interface controller may reside. Finally it is appreciated that the internal and external controllers may each physically reside on a single hardware device, or alternatively on several operatively associated hardware devices.

Included in the scope of the present invention, inter alia, are electromagnetic signals carrying computer-readable instructions for performing any or all of the steps of any of the methods shown and described herein, in any suitable order; machine-readable instructions for performing any or all of the steps of any of the methods shown and described herein, in any suitable order; program storage devices readable by machine, tangibly embodying a program of instructions executable by the machine to perform any or all of the steps of any of the methods shown and described herein, in any suitable order; a computer program product comprising a computer useable medium having computer readable program code having embodied therein, and/or including computer readable program code for performing, any or all of the steps of any of the methods shown and described herein, in any suitable order; any technical effects brought about by any or all of the steps of any of the methods shown and described herein, when performed in any suitable order; any suitable apparatus or device or combination of such, programmed to perform, alone or in combination, any or all of the steps of any of the methods shown and described herein, in any suitable order; information storage devices or physical records, such as disks or hard drives, causing a computer or other device to be configured so as to carry out any or all of the steps of any of the methods shown and described herein, in any suitable order; a program pre-stored e.g. in memory or on an information network such as the Internet, before or after being downloaded, which embodies any or all of the steps of any of the methods shown and described herein, in any suitable order, and the method of uploading or downloading such, and a system including server/s and/or client/s for using such; and hardware which performs any or all of the steps of any of the methods shown and described herein, in any suitable order, either alone or in conjunction with software.

It is appreciated that software components of the present invention including programs and data may, if desired, be implemented in ROM (read only memory) form including CD-ROMs, EPROMs and EEPROMs, or may be stored in any other suitable computer-readable medium such as but not limited to disks of various kinds, cards of various kinds and RAMs. Components described herein as software may, alternatively, be implemented wholly or partly in hardware, if desired, using conventional techniques.

Features of the present invention which are described in the context of separate embodiments may also be provided in combination in a single embodiment. Conversely, features of the invention, including method steps, which are described for brevity in the context of a single embodiment or in a certain order may be provided separately or in any suitable subcombination or in a different order.

The invention shown and described herein includes the scope of all the following claims inter alia:

1. A system for determining thresholds useful for converting cell physical levels into cell logical values in an array of memory cells storing physical levels which diminish over time, the system comprising: deterioration determining apparatus determining extent of deterioration of the physical levels and determining thresholds accordingly for at least an individual cell in said array; and reading circuitry operative to read said individual cell including reading a physical level in said cell and converting said physical level into a logical value using said thresholds, wherein said deterioration determining apparatus is operative to store predefined physical levels rather than data-determined physical levels in each of a plurality of cells and to compute extent of deterioration by determining deterioration of said predefined physical levels wherein said plurality of cells comprises a number of cells selected to as to achieve a level of reading errors which does not exceed a predetermined acceptable level; wherein said reading comprises using error correction code to eliminate errors and wherein said predetermined acceptable level comprises a predetermined maximum proportion of pages containing so many errors as to be uncorrectable by said error correction code.

2. The system of claim 1 wherein said predefined physical levels are maximum physical levels.

3. The system of claim 1 wherein said determining extent of deterioration comprises determining deterioration of said predefined physical levels and assuming that said deterioration is a known function of said physical levels.

4. The system of claim 3 wherein said known function comprises a linear function.

5. The system of claim 1 wherein said storing comprises storing said predefined physical levels in cells whose reliability is no different than the reliability of those cells in the array which are not used for storing said predefined physical levels.

6. The system of claim 1 wherein said array comprises more than one erase sector, each of which includes a subset of cells which together undergo cycles affecting said extent of deterioration; and wherein said determining of said extent of deterioration is performed no more than once per erase sector.

7. The system of claim 1 wherein said array of digital memory cells comprises a plurality of pages characterized in that the cells within each page are written onto as a single operation and wherein said determining is performed no more than once per page.

8. The system of claim 1 wherein said determining comprises computing extent of deterioration by determining deterioration of said predefined physical levels in each of a plurality of cells.

9. The system of claim 1 wherein said reading comprises binary reading and wherein said predefined physical levels comprise an ascending sequence of physical levels.

10. The system of claim 9 wherein said ascending sequence is evenly spaced.

11. The system of claim 1 wherein said physical levels comprise charge levels.

12. The system of claim 1 wherein said determining extent of deterioration comprises determining deterioration of said predefined physical levels and assuming a known function of deterioration as a function of program/erase cycle number.

13. The system of claim 1 wherein said determining extent of deterioration comprises determining deterioration of said predefined physical levels and assuming a known function of deterioration as a function of address of said predefined physical levels.

14. A method for determining thresholds useful for converting cell physical levels into cell logical values in an array of memory cells storing physical levels which diminish over time, the method comprising: determining extent of deterioration of the physical levels and systematically determining thresholds accordingly for at least an individual cell in said array; and reading said individual cell including reading a physical level in said cell and converting said physical level into a logical value using said thresholds; wherein said systematic determination of thresholds comprises computation of thresholds; wherein said computation does not assume linearity of deterioration throughout the range of physical levels stored in individual cells in said array.

15. A method according to claim 14 wherein said systematic determination of thresholds comprises use of a look-up table.

16. A system for determining thresholds useful for converting cell physical levels into cell logical values in an array of memory cells storing physical levels which diminish over time, the system comprising: deterioration determining apparatus determining extent of deterioration of the physical levels and systematically determining thresholds accordingly for at least an individual cell in said array; and reading circuitry operative to read said individual cell including reading a physical level in said cell and converting said physical level into a logical value using said thresholds; wherein said systematic determination of thresholds comprises computation of thresholds; wherein said computation does not assume linearity of deterioration throughout the range of physical levels stored in individual cells in said array.

17. A method for converting a measured physical level of a cell into a logical value, in an array of memory cells storing physical levels which diminish over time, the method comprising: determining extent of deterioration of the physical levels and determining thresholds accordingly for at least an individual cell in the array; and reading the individual cell including reading a physical level in said cell and converting said physical level into a logical value using at least some of said thresholds, wherein said determining extent of deterioration comprises storing predefined physical levels rather than data-determined physical levels in each of a plurality of cells and determining extent of deterioration by computing deterioration of said predefined physical levels; wherein said plurality of cells comprises a number of cells selected to as to achieve a level of reading errors which does not exceed a predetermined acceptable level; wherein said reading comprises using error correction code to eliminate errors and wherein said predetermined acceptable level comprises a predetermined maximum proportion of pages containing so many errors as to be uncorrectable by said error correction code.

18. A method according to claim 17 wherein said predefined physical levels are maximum physical levels.

19. A method according to claim 17 wherein said determining extent of deterioration comprises determining deterioration of said predefined physical levels and assuming that said deterioration is a known function of said physical levels.

20. A method according to claim 19 wherein said known function comprises a linear function.

21. A method according to claim 17 wherein said storing comprises storing said predefined physical levels in cells whose reliability is no different than the reliability of those cells in the array which are not used for storing said predefined physical levels.

22. A method according to claim 17 wherein said array comprises more than one erase sector, each of which includes a subset of cells which together undergo cycles affecting said extent of deterioration; and wherein said determining of said extent of deterioration is performed no more than once per erase sector.

23. A method according to claim 17 wherein said array of digital memory cells comprises a plurality of pages characterized in that the cells within each page are written onto as a single operation and wherein said determining is performed no more than once per page.

24. A method according to claim 17 wherein said determining comprises computing extent of deterioration by determining deterioration of said predefined physical levels in each of a plurality of cells.

25. A method according to claim 17 wherein said reading comprises binary reading and wherein said predefined physical levels comprise an ascending sequence of physical levels.

26. A method according to claim 25 wherein said ascending sequence is evenly spaced.

27. A method according to claim 17 wherein said physical levels comprise charge levels.

28. A method according to claim 17 wherein said determining extent of deterioration comprises determining deterioration of said predefined physical levels and assuming a known function of deterioration as a function of program/erase cycle number.

29. A method according to claim 17 wherein said determining extent of deterioration comprises determining deterioration of said predefined physical levels and assuming a known function of deterioration as a function of address of said predefined physical levels.

* * * * *